(12) United States Patent
Kato

(10) Patent No.: US 8,129,625 B2
(45) Date of Patent: Mar. 6, 2012

(54) MULTILAYER PRINTED WIRING BOARD

(75) Inventor: Shinobu Kato, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 828 days.

(21) Appl. No.: 10/551,439

(22) PCT Filed: Apr. 6, 2004

(86) PCT No.: PCT/JP2004/004977
§ 371 (c)(1),
(2), (4) Date: Sep. 29, 2005

(87) PCT Pub. No.: WO2004/091268
PCT Pub. Date: Oct. 21, 2004

(65) Prior Publication Data
US 2007/0029106 A1    Feb. 8, 2007

(30) Foreign Application Priority Data

Apr. 7, 2003  (JP) ................................ 2003-102773

(51) Int. Cl.
*H05K 1/16* (2006.01)
(52) U.S. Cl. ....................................... 174/260; 174/262
(58) Field of Classification Search .................. 174/255, 174/260, 261, 262; 361/792, 793, 794, 795
See application file for complete search history.

(56) References Cited

U.S. PATENT DOCUMENTS

| | | | | |
|---|---|---|---|---|
| 5,488,542 A | * | 1/1996 | Ito | 361/793 |
| 5,774,340 A | * | 6/1998 | Chang et al. | 361/771 |
| 5,847,936 A | * | 12/1998 | Forehand et al. | 361/794 |
| 6,203,967 B1 | | 3/2001 | Westbrook et al. | |
| 6,323,435 B1 | * | 11/2001 | Strandberg et al. | 174/255 |
| 6,323,439 B1 | * | 11/2001 | Kambe et al. | 174/262 |
| 6,333,857 B1 | * | 12/2001 | Kanbe et al. | 361/792 |
| 6,970,362 B1 | * | 11/2005 | Chakravorty | 361/782 |
| 2002/0085334 A1 | * | 7/2002 | Figueroa et al. | 361/301.4 |
| 2003/0011070 A1 | * | 1/2003 | Iijima et al. | 257/734 |
| 2004/0169198 A1 | | 9/2004 | Nagata et al. | |

FOREIGN PATENT DOCUMENTS

| | | |
|---|---|---|
| EP | 1 194 022 | 4/2002 |
| JP | 06-097362 | 4/1994 |
| JP | 6-260756 | 9/1994 |
| JP | 6-275959 | 9/1994 |
| JP | 11-054927 | 2/1999 |
| JP | 11-087919 | 3/1999 |
| JP | 11-177237 | 7/1999 |
| JP | 11274730 | 10/1999 |
| JP | 2000-101245 | 4/2000 |

(Continued)

OTHER PUBLICATIONS

Office Action dated Jul. 13, 2011 mailed in U.S. Appl. No. 12/841,626, filed Jul. 22, 2010.

*Primary Examiner* — Ishwarbhai B Patel
(74) *Attorney, Agent, or Firm* — Oblon, Spivak, McClelland, Maier & Neustadt, L.L.P.

(57) ABSTRACT

In a core substrate 30, a ground through hole 36E and a power through hole 36P are disposed in the grid formation, so that electromotive force induced in X direction and Y direction cancel out each other. As a result, even if mutual inductance is reduced and a high frequency IC chip is loaded, electric characteristic and reliability can be improved without generating malfunction or error.

13 Claims, 19 Drawing Sheets

FOREIGN PATENT DOCUMENTS

| | | |
|---|---|---|
| JP | 2000-156565 | 6/2000 |
| JP | 2000-188482 | 7/2000 |
| JP | 2000-244129 | 9/2000 |
| JP | 2000-244130 | 9/2000 |
| JP | 2001-044591 A | 2/2001 |
| JP | 2001-168531 | 6/2001 |
| JP | 2002-204077 | 7/2002 |
| JP | 2002-353365 A | 12/2002 |
| KR | 1999-6770 | 1/1999 |
| KR | 1999-0064701 | 8/1999 |

* cited by examiner

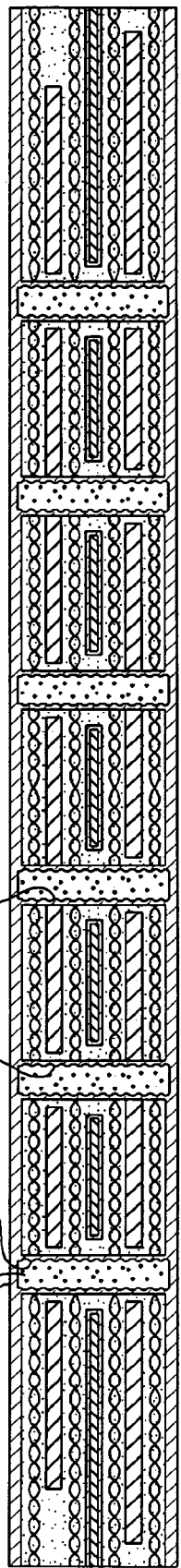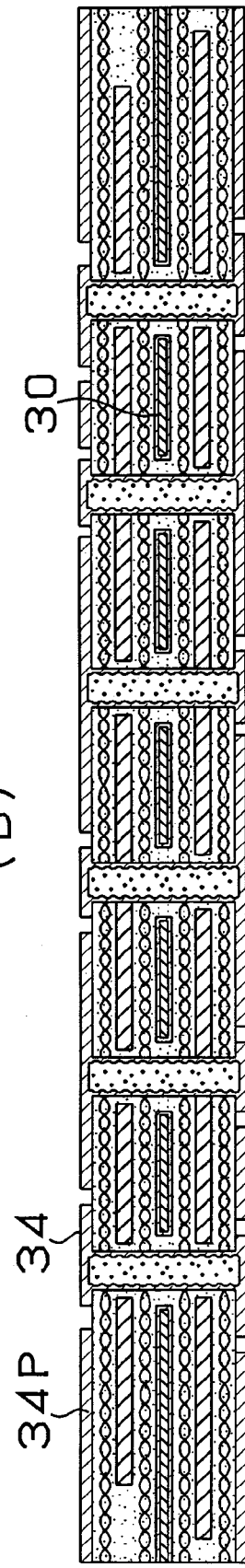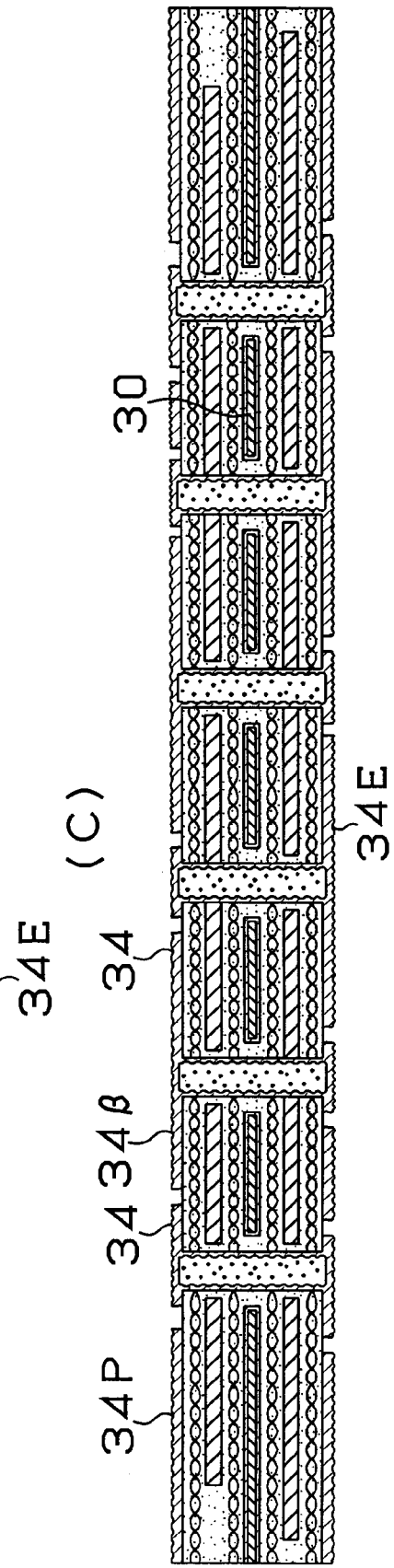
Fig.3

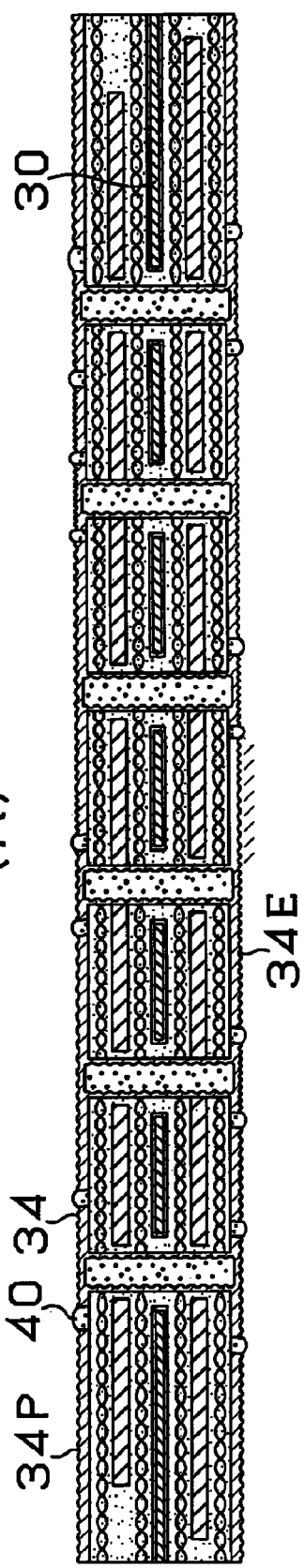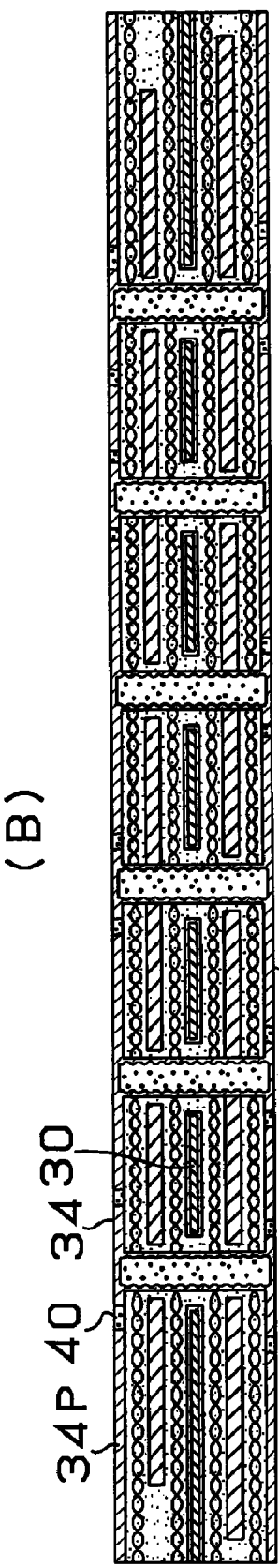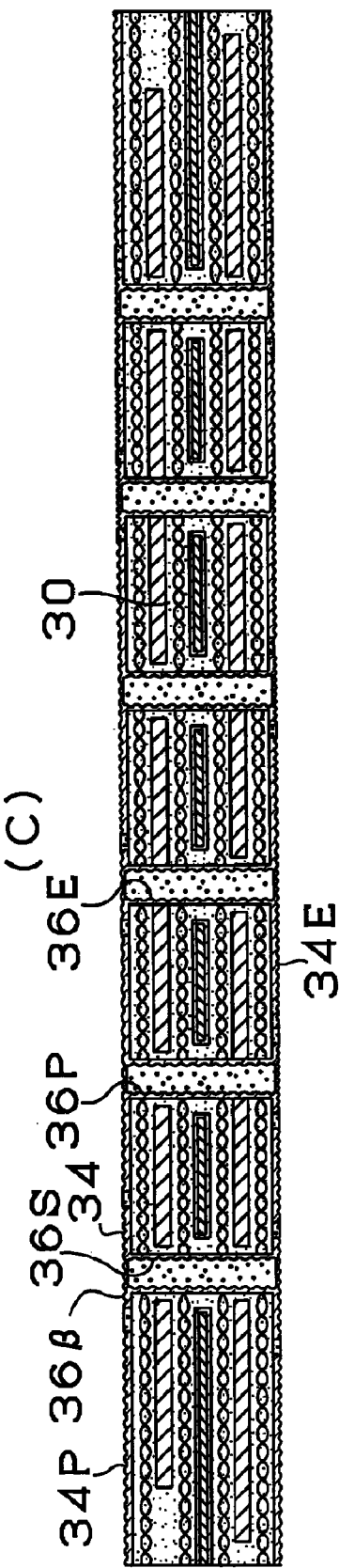
Fig. 4

Fig.5
(A)
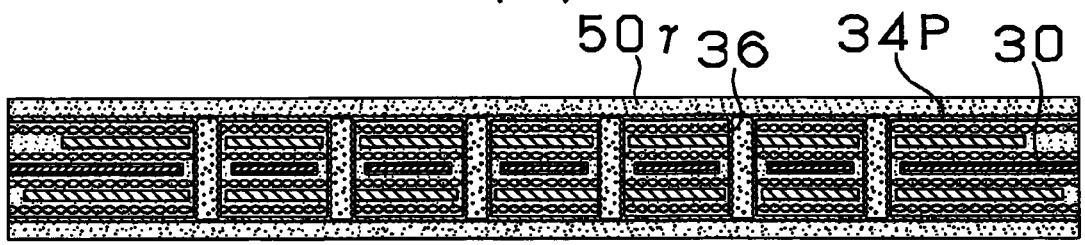
(B)
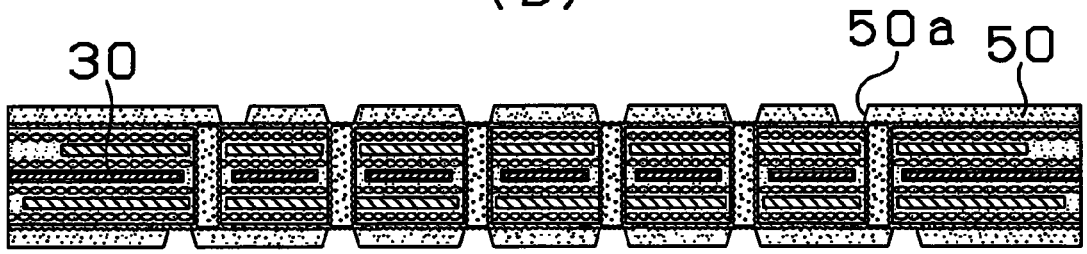
(C)
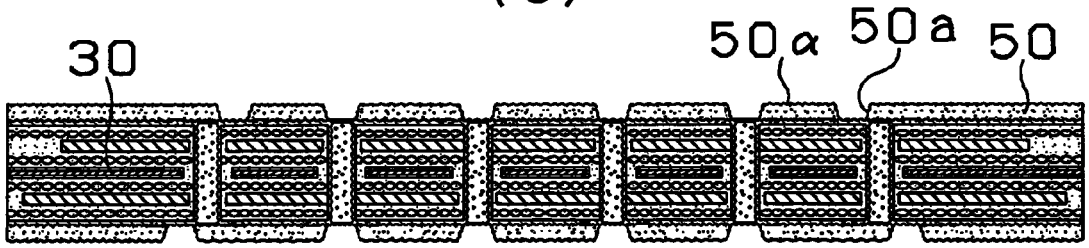
(D)
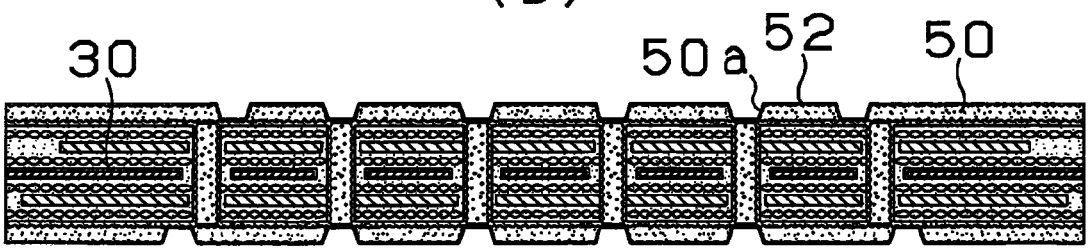

Fig.6
(A)
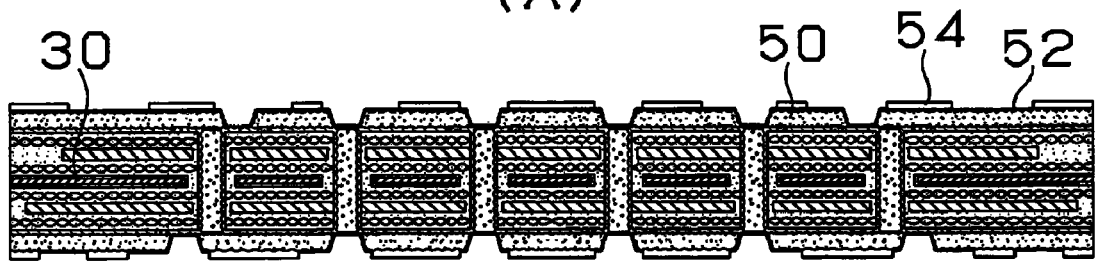
(B)
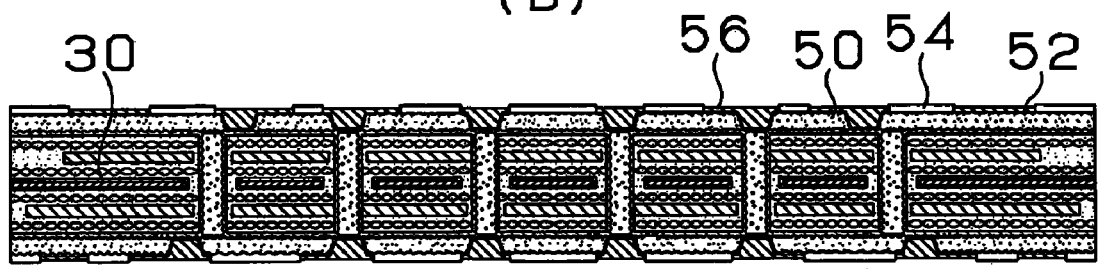
(C)
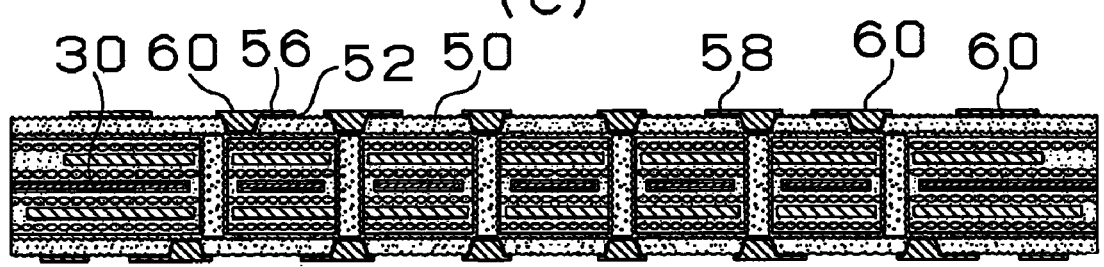
(D)
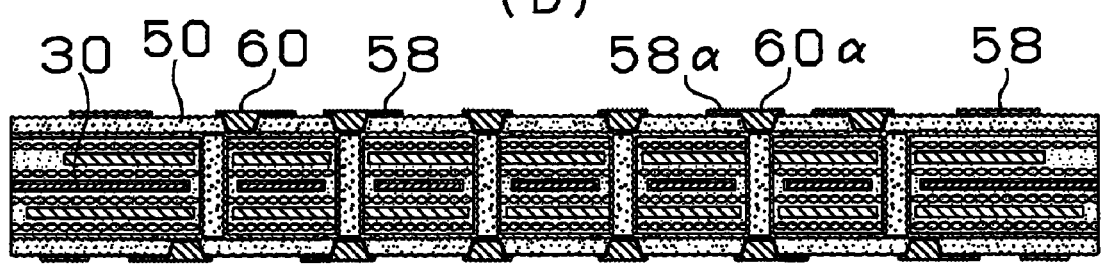

Fig. 7
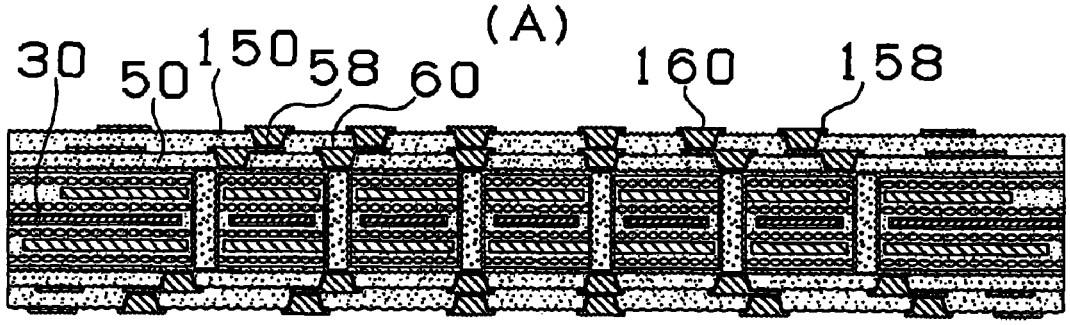
(A)
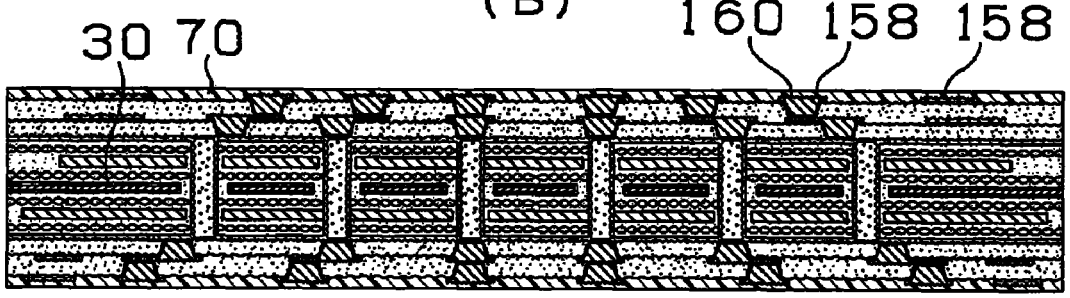
(B)
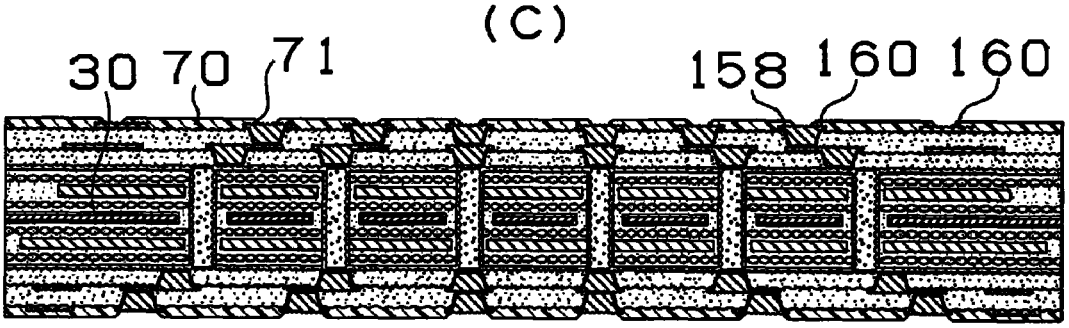
(C)
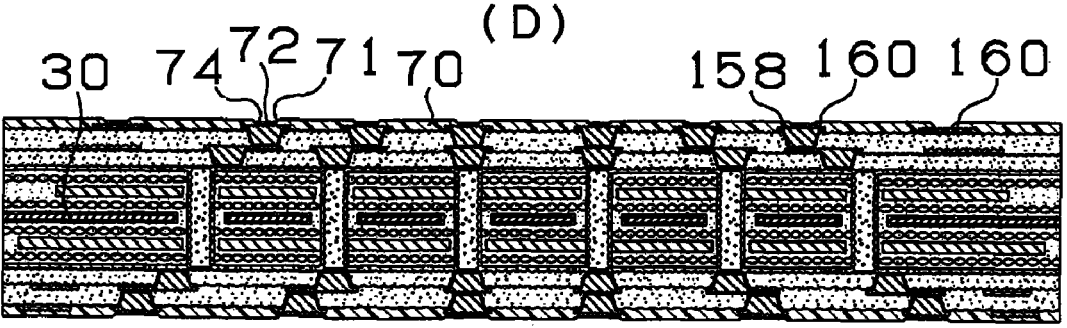
(D)

Fig. 16

| THROUGH HOLE PITCH (μm) | THROUGH HOLE DIAMETER (μm) | THICKNESS OF CORE SUBSTRATE (μm) | STAGGERED FORMATION (THICK COPPER) LOOP INDUCTANCE (pH) | GRID FORMATION LOOP INDUCTANCE (pH) | RANDOM FORMATION LOOP INDUCTANCE (pH) | FOURTH REFERENCE EXAMPLE LOOP INDUCTANCE (pH) |
|---|---|---|---|---|---|---|
| 650 | 450 | 600 | 93 | 84 | 115 | |
| 600 | 400 | 600 | 87 | 75 | 109 | 88 |
| 550 | 350 | 600 | 73 | 59 | 100 | 75 |
| 500 | 300 | 600 | 73 | 56 | 95 | 75 |
| 475 | 275 | 600 | 63 | 57 | 90 | 65 |
| 450 | 250 | 600 | 59 | 55 | 85 | 62 |
| 425 | 225 | 600 | 58 | 55 | 85 | 60 |
| 400 | 200 | 600 | 59 | 55 | — | 60 |
| 80 | 50 | 600 | 55 | 50 | 90 | 57 |
| 50 | 25 | 600 | 63 | 60 | — | |

NOTE: A DIFFERENCE BETWEEN FOURTH REFERENCE EXAMPLE AND GRID FORMATION (THICK COPPER) IS JUST A SUM OF THICKNESSES OF CONDUCTIVE LAYERS IN MULTI-LAYER CORE SUBSTRATE.

| THROUGH HOEL PITCH (μm) | STAGGERED FORMATION (THICK COPPER) | | GRID FORMATION (THICK COPPER) | |
|---|---|---|---|---|
| | CRACK IN INSULATING LAYER | RESULT OF CONDUCTIVITY TEST | CRACK IN INSULATING LAYER | RESULT OF CONDUCTIVITY TEST |
| 650 | ○ | ○ | ○ | ○ |
| 600 | ○ | ○ | ○ | ○ |
| 500 | ○ | ○ | ○ | ○ |
| 400 | ○ | ○ | ○ | ○ |
| 80 | ○ | ○ | ○ | ○ |
| 50 | × | × | × | × |

CRACK IN INSULATING LAYER : ○ NO CRACK  × CRACK
RESULT OF CONDUCTIVITY TEST : ○ NO ABNORMALITY IN RESISTANCE
  × ABNORMALITY IN RESISTANCE (B)

| THROUGH HOEL PITCH (μm) | STAGGERED FORMATION LOOP INDUCTANCE (pH) | GRID FORMATION LOOP INDUCTANCE (pH) |
|---|---|---|
| 650 | 93 | 84 |
| 600 | 87 | 75 |
| 550 | 73 | 60 |
| 500 | 63 | 56 |
| 475 | 63 | 57 |
| 450 | 59 | 55 |
| 425 | 58 | 54 |
| 400 | 55 | 52 |
| 350 | 54 | 50 |
| 300 | 54 | 50 |
| 200 | 53 | 50 |
| 100 | 54 | 49 |
| 75 | 54 | 49 |
| 60 | 55 | 50 |
| 50 | 63 | 60 |

RATIO OF CORE POWER LAYER

MULTILAYER PRINTED WIRING BOARD

TECHNICAL FIELD

This invention relates to a multilayer printed wiring board and provides a technique related to a multilayer printed wiring board capable of having improved electric characteristics and reliability without causing malfunction, error or the like even if a high frequency IC chip, particularly an IC chip in a high frequency range of 3 GHz or higher is mounted thereon.

BACKGROUND ART

In forming a buildup type multilayer printed wiring board constituting an IC chip package, interlayer insulating resin is formed on one of or each of the surfaces of a core substrate having through holes formed therein and via holes for interlayer conduction are opened by a laser or photo etching, whereby an interlayer resin insulating layer is thereby formed. A conductor layer is formed on the via holes by plating or the like and etching and the like are performed to form a pattern, thus creating a conductor circuit. Further, by repeatedly forming the interlayer insulating layer and the conductor layer, the buildup multilayer printed wiring board is obtained. By forming solder bumps and external terminals (PGA/BGA's or the like) on the front layer of the board at need, the board becomes a substrate capable of mounting an IC chip thereon or a package substrate. The IC chip is C4 (flip-chip) mounted, whereby the IC chip is electrically connected to the substrate.

As prior art of the buildup type multilayer printed wiring board, there are known JP1994-260756A and JP1994-275959A. In both of the publications, a land is formed on a core substrate having through holes filled with resin filler, interlayer insulating layers having via holes formed therein are provided on the both surfaces of the substrate, respectively, a conductor layer is formed by an additive method and the conductor layer is connected to the land, thereby obtaining a high density multilayer wiring board having fine wirings formed thereon.

However, as the frequency of an IC chip is higher, the noise of occurrence of becomes higher. Particularly if the frequency of the IC chip exceeds 3 GHz, the frequency of occurrence of malfunction or error considerably increases. If the frequency exceeds 5 GHz, the IC chip often turns inoperative. Due to this, it cannot perform operations that the computer should do, i.e., cannot perform desired functions and operations such as delay of the recognition of an image, the changeover of a switch and the transmission of data to the outside of the computer.

If the substrate for an IC chip of this type which can not perform the operations is to be subjected to a non-destructive test and to be dissembled, no problems such as short-circuit or opens do not occur to the substrate itself and if the IC chip having a low frequency (particularly less than 1 GHz) is mounted on the substrate, then no malfunction or error occurs to the IC chip.

A high frequency IC chip has enabled high-speed operation while suppressing generation of heat by increasing or decreasing consumption of power intermittently. For example, it consumes electric power of several tens W instantaneously although it usually consumes only several W. According to an estimation, if loop inductance of a printed wiring board is high at the time of this consumption of several tens W, supplied voltage drops thereby leading to malfunction.

The present invention intends to propose an IC chip for high frequency region, particularly, a multi-layer printed wiring board or a packaged board in which malfunction or error never occurs even if 3 GHz is exceeded.

DISCLOSURE OF THE INVENTION

As a result of accumulated researches for achieving the above-mentioned object, the inventor and other people have reached an invention including a following content as its major configuration. That is, the technical feature of the present invention exists in a multi-layer printed wiring board in which an interlayer insulating layer and a conductive layer are formed on both sides or a single side of a core substrate having a plurality of through holes and electric connection is carried out through via holes, the through holes in the core substrate being disposed so that a ground through hole and a power through hole adjoin each other.

By disposing the ground through hole adjacent to the power through hole, induced electromotive forces cancel out each other because the directions of the induced electromotive forces are opposite. As a result, noise is reduced so that the function of a substrate never drops. Thus, malfunction and delay are eliminated. In other words, mutual inductance can be reduced. Then, loop inductance of a printed wiring board decreases, so that the voltage of transistor in the IC always stabilizes thereby operating the transistor normally.

At this time, it is more preferable if a distance between the both through holes are shorter. That is, as a result, inductance can be reduced relatively.

A further technical feature of the present invention exists in a multi-layer printed wiring board in which an interlayer insulating layer and a conductive layer are formed on both sides or a single side of a core substrate having a plurality of through holes and electric connection is carried out through via holes, the through holes in the core substrate including two or more ground through holes and two or more power through holes, such that the ground through hole and the power through hole are disposed in the grid formation or in a staggered formation at adjacent positions.

In case of the grid formation, ground through holes (or power through holes) are disposed diagonally and power through holes (or ground through holes) are disposed at the other positions. Such a configuration makes electromotive forces induced in X direction and Y direction cancel out each other.

This will be explained with reference to FIG. 11(A) showing schematically an example in which the through holes are disposed in the grid formation. As for through holes disposed in the grid formation, power through holes VCC1, VCC2 are disposed at an equal interval to a ground through hole GND1 and a ground through hole GND 2 is disposed diagonally with the ground through hole GND1. Due to this 4-core (quad) structure, cancellation of induced electromotive forces by two or more ground through hole VCCs (or power through hole GNDs) to a single power through holeGND (or ground through hole VCC) is carried out. Thus, because mutual inductance of the through holes can be reduced and an influence of induced electromotive force is eliminated, malfunction or delay becomes unlikely to occur.

This will be explained with reference to FIG. 11(B) showing schematically an example in which the through holes are disposed in the staggered formation. As for the through holes disposed in the staggered formation, ground through holes GND1, GND2, GND3, GND4 are disposed at an equal distance around a single power through hole VCC1. At this time, it is preferable to dispose the ground through hole GND and the power through hole VCC with the equal distance. Due to this structure, cancellation of induced electromotive forces by one or more power through holes VCC (or ground through holes GND) to a single ground through hole GND (or power through hole VCC) is executed. Thus, because mutual inductance of the through holes can be reduced and an influence of induced electromotive force is eliminated, malfunction or delay becomes unlikely to occur.

The grid formation reduces inductance more than the staggered formation. FIGS. 11(A), (B) are schematic diagrams showing a case where a minimum units of two or more ground through holes and two or more power through holes are disposed. FIGS. 11(D), (E) show a case where four of the minimum units are disposed. FIG. 11(D) shows a case of the grid formation and FIG. 11(E) shows a case of the staggered formation. To a VCC located outside of the grid formation, two GNDs are disposed at the nearest positions. On the other hand, to a VCC located outside of the staggered formation, a single GND is disposed at the nearest position. To a VCC inside of the grid formation and a VCC inside of the staggered formation, four GNDs are disposed at the nearest position.

Originally, the ground through holes GND and the power through holes VCC are likely to be affected by magnetic field. Thus, in case of high frequency, high-speed IC chip, its inductance increases. Consequently, the supply of power to a transistor in the IC is delayed so that the transistor does not turn ON. A problem as a substrate for operating the high-speed driven IC properly is generated. Thus, it is necessary to consider an arrangement for suppressing an influence of inductance by the ground through hole GND and the power through hole VCC. For example, a demand for higher density (higher density, fine wiring) is not always satisfied by just disposing the through holes at a narrow interval. The above-described arrangement reduce each inductance. Then, the loop inductance is reduced so that the supply of power to the transistor of the IC is not delayed.

A distance between the ground through hole and the power through hole (a pitch indicated in FIG. 11(C); a distance between the center of the ground through hole GND and the center of the power through hole VCC) is desired to be in a range of 60 to 600 µm. By reducing the distance between the walls of the through holes, mutual inductance can be dropped. If it is less than 60 µm, any insulating gap cannot be secured between the through holes, thereby causing such a fault as short-circuit. Due to an insulating gap or the like, it can be difficult to set the loop inductance within the range of a design permissible value. If it exceeds 600 µm, even if the through holes are disposed in the grid formation or in the staggered formation, the effect of reducing the loop inductance drops. If it is in the range of 80 to 600 µm, insulating gap can be secured so as to reduce the loop inductance and improve the electric characteristic.

It is desirable that the diameter of the ground through hole (outside diameter of the through hole shown in FIG. 11(C)) is 50 to 500 µm and the diameter of the power through hole is 50 to 500 µm.

If it is less than 50 µm, it is likely to be difficult to form any conductive layer within the through hole. Additionally, self-inductance rises.

Although if it exceeds 500 µm, the self-inductance per piece can be reduced, the quantity of ground lines and power lines which can be disposed within a limited area decreases, so that reduction of entire inductance by converting the ground line and the power line into multiple lines cannot be achieved. The reason is that if through holes are disposed in the grid formation or in the staggered formation, such a fault as short-circuit occurs depending on a through hole pitch. That is, formation of the through holes itself becomes difficult.

It is more preferable to form through holes in a range of 75 to 585 µm. In this range, the self-inductance can be dropped and by increasing the quantity of wires, entire inductance can be reduced thereby the electric characteristic being improved. Further, the through hole pitch can be turned into a narrow pitch.

It is preferable that one or two or more through holes are so constructed that all layers are stacked from just above the through hole or on land of the through hole up to an outermost layer. They are desired to be formed just above the through hole. To connect the through holes, land is formed on the through holes with a lid structure by lid plating and via-on-through holes are formed in a stack condition thereon. As a result, from the IC chip to an external terminal or capacitor are placed on a straight line so that they are connected at the shortest distance thereby reducing the inductance further. In this case, the via holes are more preferred to be formed on the GND through hole and the VCC through hole in the grid formation or in the staggered formation. All through holes disposed just below the IC in the grid formation or in the staggered formation are preferred to be in the stack condition and the via holes are preferred to be filled with conductor.

The ground through hole and the power through hole are preferred to be disposed just below the IC chip.

By disposing them just below the IC chip, a distance between the IC and an external terminal or capacitor can be reduced thereby dropping the inductance. As the core substrate in this case, it is permissible to use resin substrate, ceramic substrate or metal substrate impregnated with core material such as glass epoxy resin, composite core substrate employing resin, ceramic and metal compositely, a substrate provided with a (power) conductive layer in the inner layer of those substrates and multi-layer core substrate in which three or more conductive layers are formed.

It is permissible to use a core substrate formed according to a method for a general printed wiring board, for forming a conductive layer on a substrate in which metal is buried, by plating or sputtering in order to increase the thickness of the power layer.

In case of the multi-layer substrate, the sum of the thicknesses of an outer layer and inner layer of the core substrate is the thickness of the core conductive layer. That is, the purpose of forming into multi-layer structure is to increase the thickness of the conductive layer of the core substrate and its effect is not changed.

In this case, the core substrate may be composed of three layers (outer layer+inner layer). As required, it is permissible to use an electronic part accommodating core substrate in which such parts as capacitor, dielectric layer and resistor are buried in the inner layer of the core substrate. The insulating material of the core is permitted to be of dielectric material.

The core substrate of the present invention is defined as follows. It is a hard base material impregnated with core material and the like and via hole is formed on both sides or a single side thereof using insulating resin layer containing no core material by photo via or laser and then, a conductive layer is formed to achieve electric connection between layers. The thickness of the core substrate is relatively larger than the thickness of the resin insulating layer. Basically, in the core substrate, conductive layers, mainly power layers, are formed and signals lines are formed only for connecting the front and rear surfaces.

In this case, the conductor thicknesses of the GND layer and the VCC layer formed in the core substrate are desired to be large. Particularly, it is more preferable that the thickness of the conductive layer in the core substrate is larger than the thickness of the conductive layer on the interlayer insulating layer.

By increasing the thickness of the conductive layer in the core substrate, the conductive layer of the power layer in the core substrate thickens so that the strength of the core substrate is intensified. As a result, even if the core substrate itself is thinned, warpage and generated stress can be relaxed in the substrate itself.

Further, the volume of the conductor itself can be increased. By increasing the volume, resistance in the conductor can be reduced. Consequently, electric transmission in the signal line is kept from being hampered. Thus, no loss is induced in a transmitted signal and the like. Even thickening only the conductive layer in a core portion exerts that effect.

By using the conductive layer as the power layer, the capacity of power supply to the IC chip can be improved. By using the conductive layer as a ground layer, noise overlapping on a signal and power to the IC chip can be reduced. That is, reduction of resistance of the conductor is kept from hampering the supply of power. For the reason, when the IC chip is mounted on the multi-layer printed wiring board, loop inductance from the IC chip to the substrate to power supply can be reduced. As a consequence, the shortage of power at the time of an initial operation decreases, thereby making the shortage of power unlikely to occur and thus, even if an IC chip having a higher frequency region is mounted, malfunction or error at the initial startup is never generated.

In case where power is supplied to the IC chip through IC chip to substrate to capacitor or power layer to power supply also, the same effect is exerted. The above-mentioned loop inductance can be reduced.

Particularly when the thickness of the conductive layer used as power layer of the core substrate is larger than the thickness of the conductive layer on the interlayer insulating layer on a single side or both sides of the core substrate, the above-described effect can be exerted to a maximum extent. The conductive layer on the interlayer insulating layer in this case means a conductive layer formed by plating or sputtering on the interlayer resin insulating layer formed of resin and impregnated with no core material, in which a via hole is formed as a non-through hole for connecting between layers. In addition to this, if any via hole is formed although it is not limited to any particular one, that conductive layer falls under the above-mentioned conductive layer.

The power layer of the core substrate may be disposed on the front surface or inner layer of the substrate or both of them. The inner layer may be formed into multi-layer structure of two or more. Basically, if the power layer in the core substrate is thicker than the conductive layer on the interlayer insulating layer, that effect is kept. It is desired to be formed in the inner layer.

Assuming that the thickness of the conductive layer on the core substrate is $\alpha1$ and the thickness of the conductive layer on the interlayer insulating layer is $\alpha2$, preferably, $\alpha2 < \alpha1 \leq 40\alpha2$.

If $\alpha1 \leq \alpha2$, there is no effect to the power shortage. That is, in other words, regarding voltage drop generated at the initial operation, an effect of suppressing the degree of the drop is not evident.

In the case of $\alpha1 > 40\alpha2$, if any conductive layer is formed on the front surface side of the core substrate, it is difficult to form a land and the like for connecting with the core substrate. Further, if an interlayer insulating layer is formed as an upper layer, unevenness intensifies so that swelling is generated in the interlayer insulating layer and thus, it comes that impedance cannot be matched.

The thickness $\alpha1$ of the conductive layer is more preferred to be $1.2\alpha2 \leq \alpha1 \leq 20\alpha2$. It has been verified that in this range, no malfunction or error of the IC chip due to the voltage shortage (voltage drop) is generated.

It is preferable to use a multi-layer core substrate having three or more conductive layers.

At this time, preferably, two or more layers of the GND layers or VCC layers are formed and the GND layer and the VCC layer are disposed alternately. The thickness of each insulating layer between respective conductive layers is preferred to be substantially equal. The reason is that because operations of reducing both inductances are executed uniformly, total inductance can be reduced easily. Further, impedance is easy to match so as to improve the electric characteristic.

What is more preferable is that there are provided two or more VCC layers and GND layers. As a result, the GND layer and the VCC layer disposed in the inner layer reduces mutual inductance as compared with the surface portion. The effect appears more conceivably.

A distance between the GND layer and the VCC layer is preferred to be in the range of 25 to 400 μm. If it is less than 25 μm, it is likely difficult to secure insulation characteristics regardless of material. If reliability test such as porosity test is carried out, short-circuit can occur between conductive layers. If it exceeds 400 μm, the effect of reducing inductance is reduced. That is, because of such a distance, the effect of mutual inductance is cancelled out.

For both the GND layer and the VCC layer, it is preferable to increase the thickness of their conductive layers. The reason is that by increasing both the volumes, the effect of reduction of resistance is easy to obtain. The thickness of the conductor is preferred to be in the range of 25 to 500 μm. If it is less than 25 μm, the effect of reduction of resistance is likely to weaken. If it exceeds 500 μm, swelling can be generated in a conductor circuit of a signal line or the like formed above it, so that a problem occurs in points of impedance matching. A demand for forming the substrate itself into a thin film becomes difficult to satisfy because the substrate itself comes to thicken. In this case, it is preferred to be larger than the thickness of the conductive layer in the interlayer insulating layer.

Material of the core substrate was verified with a resin substrate and it was verified that the same effect was secured in ceramic substrate and metal core substrate as well. As the material of the conductive layer, copper was used and it was not verified in case of other metals that the effects were cancelled out so that malfunction or error increased. Thus, it is considered that a difference of material of the core substrate or a difference of material for forming the conductive layer does not influence the effect. What is more preferable is that the conductive layer in the core substrate and the conductive layer in the interlayer insulating layer are formed of a same metal. Because characteristics such as electric characteristic and thermal expansion coefficient and physical property are not changed, this effect can be exerted.

BRIEF DESCRIPTION OF THE DRAWINGS

FIG. 3 is a step diagram showing the method for manufacturing the multilayer printed wiring board according to Embodiment 1.

FIG. 4 is a step diagram showing the method for manufacturing the multilayer printed wiring board according to Embodiment 1.

FIG. 5 is a step diagram showing the method for manufacturing the multilayer printed wiring board according to Embodiment 1.

FIG. 6 is a step diagram showing the method for manufacturing the multilayer printed wiring board according to Embodiment 1.

FIG. 7 is a step diagram showing the method for manufacturing the multilayer printed wiring board according to Embodiment 1.

FIG. 16 is a table showing a measured result of the loop inductance as to the lattice arrangement, the plover arrangement and random arrangement of through holes.

FIG. 17(A) is a table showing a result of insulation layer crack test and conductive test as to the lattice arrangement, the plover arrangement and random arrangement of through holes, FIG. 17(B) is simulated result of the loop inductance as to the lattice arrangement, the plover arrangement and random arrangement of through holes.

BEST MODE FOR CARRYING OUT THE INVENTION

The multi-layer printed wiring board according to a first embodiment of the present invention will be described with reference to FIGS. 1-9.

First Embodiment

4-Layer Multi-Layer Core Substrate

Figure 1:
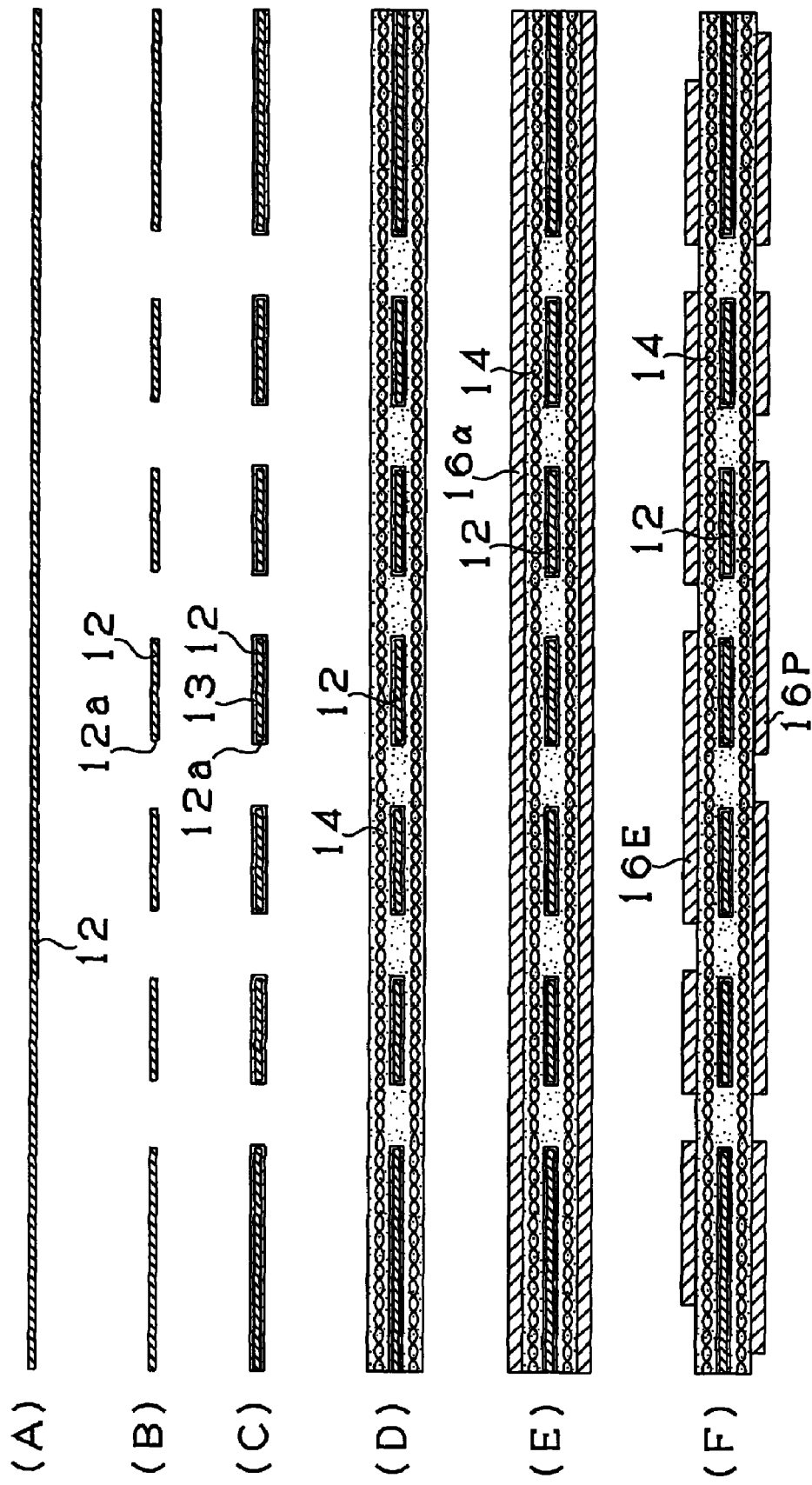
FIG. 1 is a step diagram showing a method for manufacturing a multilayer printed wiring board according to Embodiment 1 of the present invention.
Figure 2:
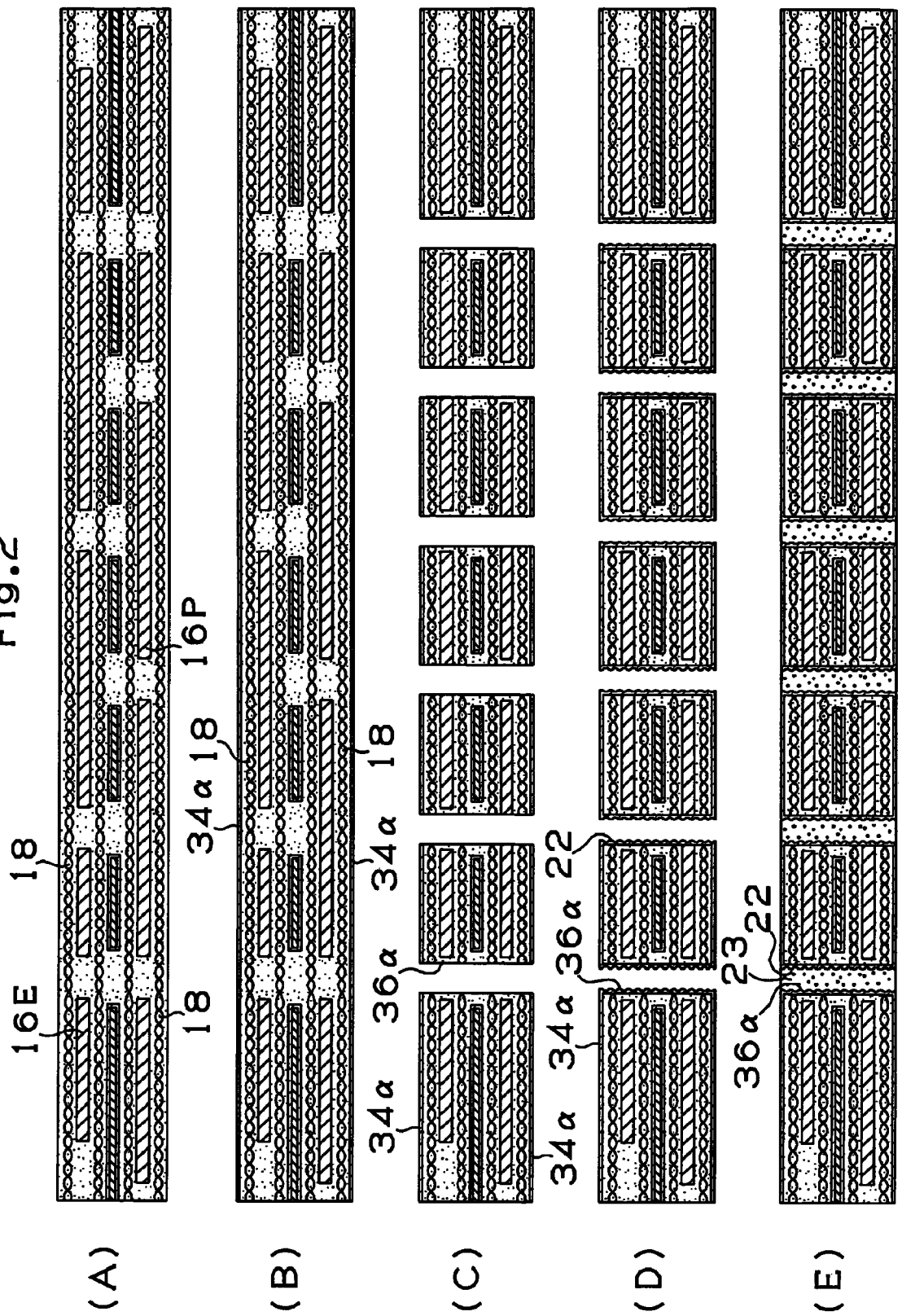
FIG. 2 is a step diagram showing the method for manufacturing the multilayer printed wiring board according to Embodiment 1.
Figure 8:
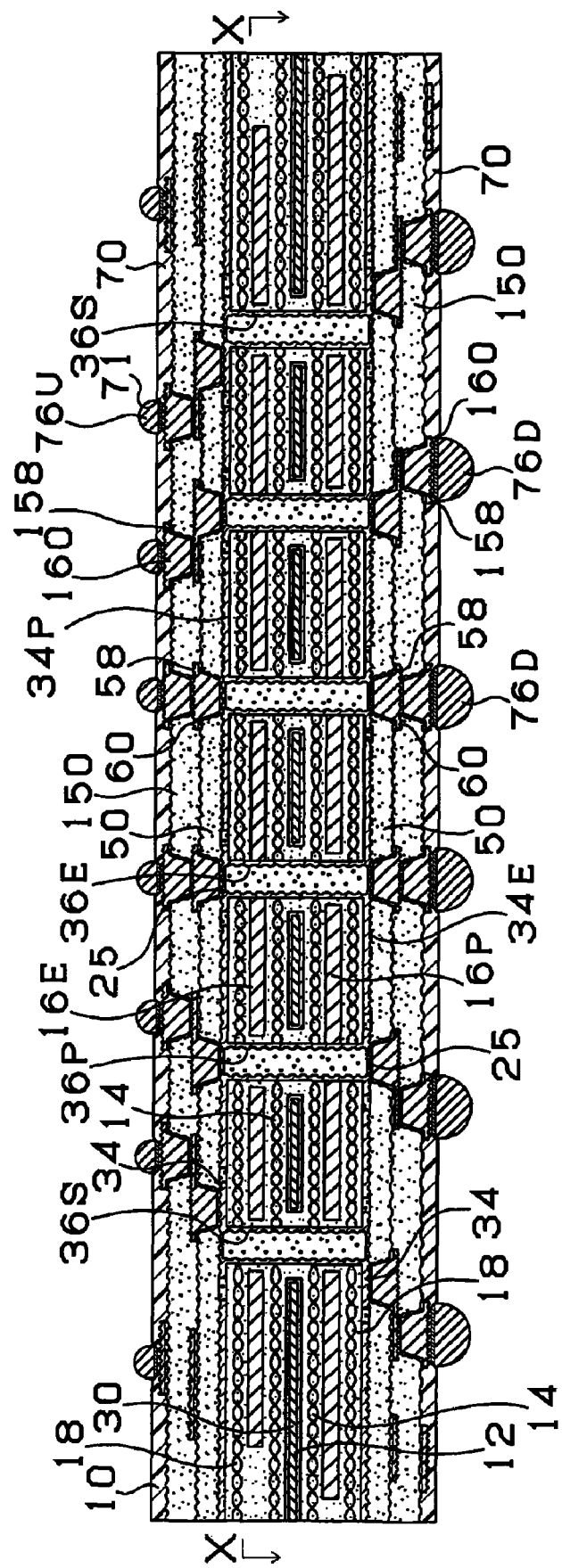
FIG. 8 is a cross-sectional view for the multilayer printed wiring board according to Embodiment 1.
Figure 9:
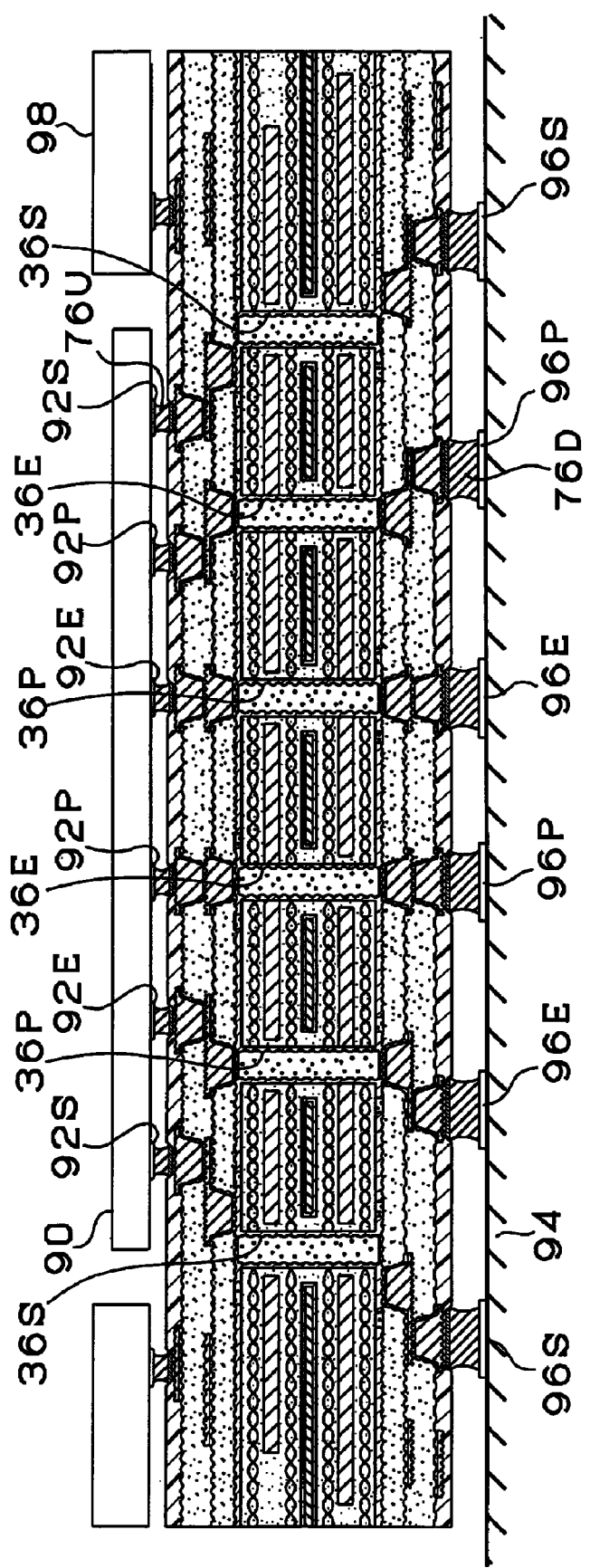
FIG. 9 is a cross-sectional view showing a state in which an IC chip is mounted on the multilayer printed wiring board according to Embodiment 1.

First, the configuration of a multi-layer printed wiring board 10 according to the first embodiment will be described with reference to FIGS. 8, 9. FIG. 8 shows a sectional view of the multi-layer printed wiring board 10 and FIG. 9 shows a condition in which an IC chip 90 is mounted on the multi-layer printed wiring board 10 shown in FIG. 8, and this is mounted on a daughter board 94. As shown in FIG. 8, the multi-layer printed wiring board 10 utilizes a multi-layer core substrate 30. A conductor circuit 34 and a conductive layer 34P are formed on the front side of the multi-layer core substrate and the conductor circuit 34 and a conductive layer 34E are formed on the rear side thereof. The conductive layer 34P on the upper side is formed as a plain layer for power supply and the conductive layer 34E on the lower side is formed as a plain layer for grounding. A conductive layer 16E is formed as an inner layer on the front side inside the multi-layer core substrate 30 and a conductive layer 16P is formed on the rear side. The conductive layer 16E on the upper side is formed as a plain layer for grounding and the conductive layer 16P on the lower side is formed as a plain layer for power supply. Connection of the plain layers 34P, 16P for power supply is carried out by the through hole 36P for power supply and the via hole. Connection of the plain layers 34E, 16E for grounding is carried out by the through hole 36E for grounding and the via holes. Connection of signals on the upper side and lower side of the multi-layer core substrate 30 is carried out through the signal through hole 36S and via hole. The plain layer may be a single layer provided on a single side or composed of two or more layers. It is preferable that it is formed of two to four layers. Because improvement of the electric characteristic in a case of four or more layers has not been verified, forming multiple layers more than four only provides the same effect as the four layers. Particularly, the reason why the inner layer is composed of two layers is that the degrees of elongation of the substrates are arranged neatly in terms of stiffness matching of the multi-layer core substrate, so that warpage is unlikely to occur. A metallic plate 12 which is electrically isolated may be accommodated in the center of the multi-layer core substrate 30 (Although the metallic plate 12 takes a role as a core material, it is not electrically connected to the through hole or via hole. Mainly, this serves for improving the stiffness against the warpage of the substrate. Further, if a low thermal expansion metal such as 36 alloy and 42 alloy is used as the metallic plate, the thermal expansion coefficient of a printed wiring board can be reduced. This makes the IC and bump difficult to destroy.) On the front surface side of the metallic plate 12 is formed the conductive layer 16E as an inner layer via the insulating resin layer 14 and on the rear surface side is formed the conductive layer 16P. Further, the conductor circuit 34 and the conductive layer 34P are formed on the front surface side via the insulating resin layer 18 and the conductor circuit 34 and the conductive layer 34E are formed on the rear surface side. According to this embodiment, the thickness of each conductive layer in the inner layer of the multi-layer core substrate is 70 μm and the thickness of the conductive layer on the front and rear surface sides is 15 μm.

On the conductive layers 34P, 34E on the surface of the multi-layer core substrate 30 are disposed interlayer resin insulating layer 50 in which the via hole 60 and the conductor circuit 58 (12 μm) are formed and interlayer resin insulating layer 150 in which the via hole 160 and conductor circuit 158 (12 μm) are formed. Solder resist layer 70 is formed above the via hole 160 and the conductor circuit 158. Bumps 76U, 76D are formed in the via hole 160 and the conductor circuit 158 via an opening portion 71 in the solder resist layer 70.

As shown in FIG. 9, the bump 76U on the upper side of the multi-layer printed wiring board 10 is connected to a signal land 92S, a power land 92P and a ground land 92E of the IC chip 90. Further, a chip capacitor 98 is mounted. On the other hand, the external terminal 76D on the lower side is connected to a signal land 96S, a power land 96P and a ground land 96E on the daughter board 94. The external terminal in this case refers to PGA, BGA, solder bump and the like.

Figure 10:
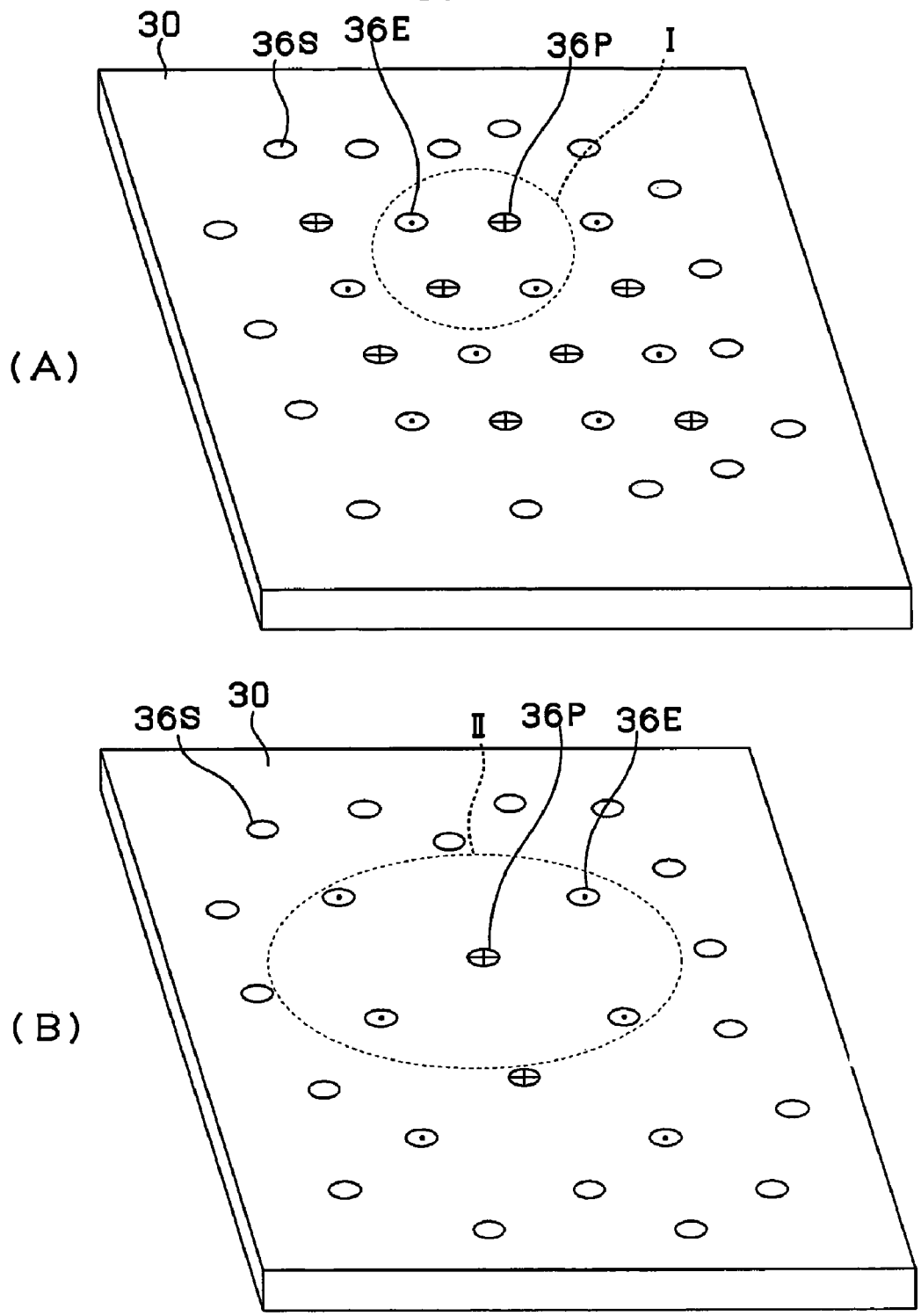
FIG. 10(A) is a X-X cross-sectional view of the multilayer printed wiring board shown in FIG. 8.
FIG. 10(B) is a cross-sectional view for a multilayer printed wiring board according to modified example of Embodiment 1.
Figure 11:
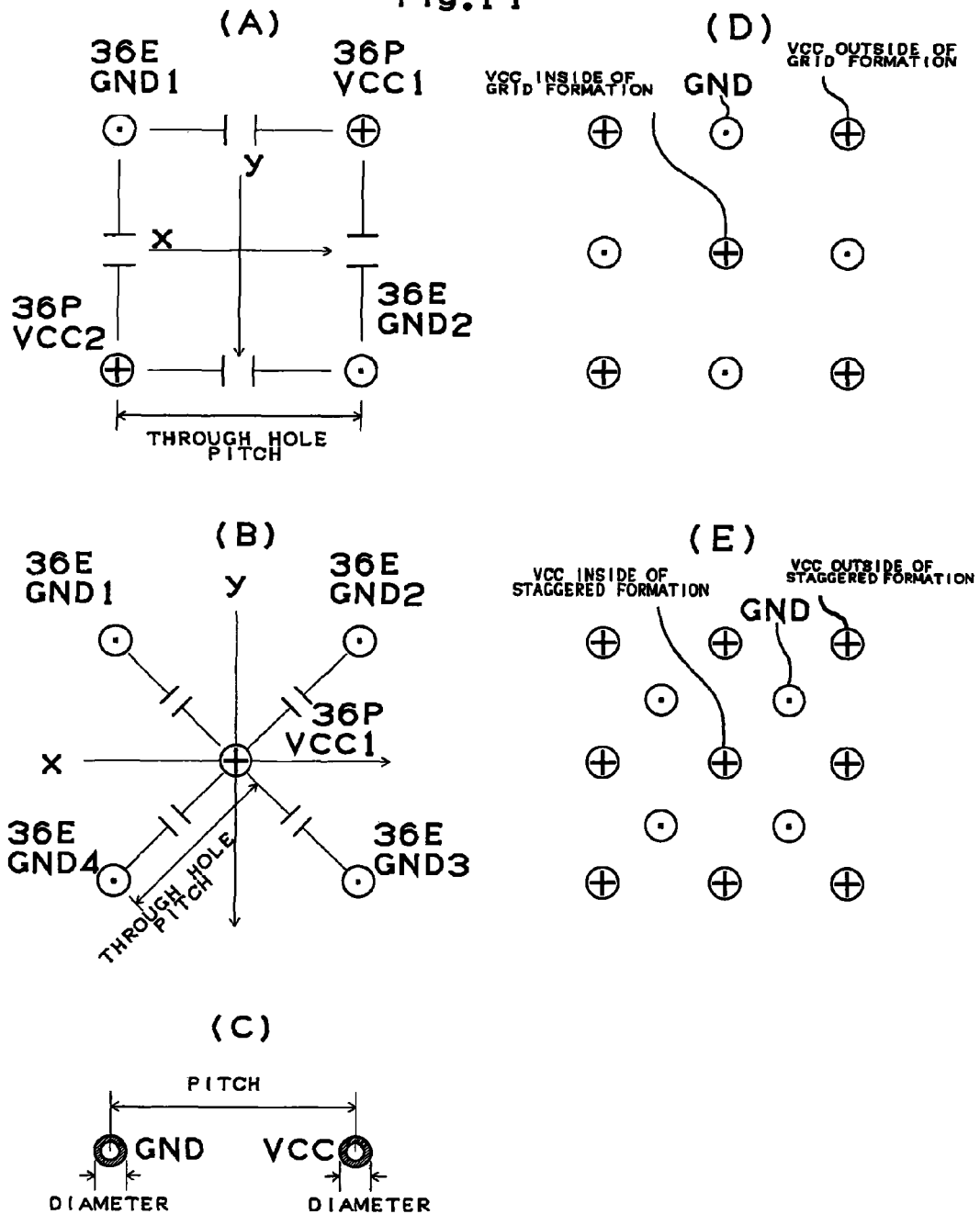
FIG. 11(A) is an enlarged explanatory view showing inside dotted line I in FIG. 10(A)
FIG. 11(B) is an enlarged explanatory view showing inside dotted line II in FIG. 11(B)
FIG. 11(C) is an explanatory view showing pitch of through holes.
FIG. 11(D) is an explanatory view showing plover arrangement.
FIG. 11(E) is an explanatory view showing lattice arrangement.

FIG. 10 shows a sectional view taken along the line X-X of the multi-layer printed wiring board 10 of FIG. 8. That is, FIG. 10 shows a plan view of the core of the multi-layer core substrate 30. In the Figures, for convenience of understanding, the power through holes 36P are marked with a downward symbol (+ in the Figure) and the ground through holes 36E are marked with a upward symbol (black circle in the center of a hole) and the signal through holes 36S are marked with nothing. FIG. 11(A) is an explanatory diagram showing a portion I indicated with dotted line in FIG. 10(A) in enlargement. According to the first embodiment, the power through hole 36P and the ground through hole 36E are disposed in the grid formation at adjacent positions. That is, ground (or power) through holes are disposed at diagonal positions and power (or ground) through holes are disposed at the other positions. Such a configuration cancels out electromotive forces inducted in the X direction and Y direction.

As for the through holes disposed in the grid formation as described above with reference to FIG. 11(A), a pair of the ground through hole 36E (GND1) and the power through hole 36P are disposed at an equal interval in the grid formation and the ground through hole 36E (GND2) is disposed diagonally with the GND1. Due to this 4-core (quad) structure, cancellation of induced electromotive forces by two or more VCCs (or GNDs) to a single GND (or VCC) is carried out. Thus, because mutual inductance can be reduced and an influence of induced electromotive force is eliminated, an influence of noise can be reduced and further by decreasing the amount of inductance, loop inductance drops so that no voltage drop occurs in an IC chip in which consumption of power changes intermittently when the consumption of power increases, thereby making malfunction and delay difficult to occur.

Further, as shown in FIG. 8, the power through hole 36P and ground through hole 36E disposed in the center of the multi-layer core substrate 30 adopt such a stack structure in which the via hole 60 and the via hole 160 are provided just above the through hole. To connect the through holes 36E, 36P with the via hole 60, a land 25 having a lid structure is formed of lid plating over the through hole 36E and the through hole 36P and the via hole 60 is formed thereon in a stack condition. Further, the via hole 160 is provided just above the via hole 60 on the upper side, so that the via hole 160 is connected to the power land 92E and ground land 92E of the IC chip 90 via the bump 76U. Likewise, the via hole 160 is provided just below the via hole 60 on the lower side and the via hole 160 is connected to the power land 96P and ground land 96E of the daughter board 94 via the bump 76D.

Because of the via-on-through hole and stack structure, from the IC chip 90 up to the bumps (external terminals) 76E, 76P of the daughter board or a capacity (not shown) comes on a same straight line so as to provide a shortest distance, thereby reducing inductance further. The power through hole and ground through hole disposed in the grid formation or in staggered formation just below the IC, which is a minimum unit, is preferred to be in the stack condition and it is more preferable that all the ground and power through holes just below the IC are formed in the stack condition.

The ground through hole 36E and the power through hole 36P are disposed just below the IC chip 90. By disposing them just below the IC chip 90, the distance between the IC 90 and the bump (external terminal) 96E, 96P of the daughter board 94 or a capacitor (not shown) can be reduced. Thus, inductance can be decreased.

A distance (pitch) between the through holes 36E, 36P and 36S is set to 80 to 600 μm and the signal through hole diameter 36S (outside diameter) is set to 50 to 400 μm. The distance (pitch) between the ground through hole 36E and the power through hole 36P is set to 80-600 μm and the diameter (outside diameter) of the ground through hole 36E is set ○ 50 to 400 μm and the diameter (outside diameter) of the power through hole 36P is set to 50 to 400 μm (see FIG. 16). As the through holes 36E, 36P, 36S, through conductive layers are formed in the core substrate 30 and their gaps are filled with insulating resin. Additionally, the inside of the through hole may be filled completely with conductive paste or plating. The signal through hole is preferred to be formed at other portion than just below the IC. The portion just below IC is likely to be affected by noise because the power through holes and ground through holes are gathered in high density. Then, the pitch of the signal through hole is desired to be larger than the pitches of the power through hole and the ground through hole. As a result, noise becomes unlikely to be loaded on a signal.

Here, the conductive layers 34P, 34E on the front surface side of the core substrate 30 are formed in thickness of 5 to 40 μm, the inner conductive layers 16P, 16E are formed in the thickness of 5 to 250 μm, and the conductor circuit 58 on the interlayer resin insulating layer 50 and the conductor circuit 158 on the interlayer resin insulating layer 150 are formed in the thickness of 5 to 25 μm.

In the multi-layer printed wiring board of the first embodiment, by increasing the thickness of the power layer (conductive layer) 34P and the conductive layer 34 on the front surface side of the core substrate 30 and the inner power layer (conductive layer) 16P, the conductive layer 16E and the metallic plate 12 provided inside, the strength of the core substrate is increased. As a result, even if the core substrate itself is thinned, warpage and stress generated can be relaxed by the substrate itself.

Further, by increasing the thickness of the conductive layers 34P, 34E and the conductive layers 16P, 16E, the volume of the conductor itself can be increased. By increasing the volume, resistance of the conductor can be reduced.

By using the conductive layers 34P, 16P as a power layer, the supply capacity of power to the IC chip 90 can be improved. As a result, when the IC chip is mounted on the multi-layer printed wiring board, loop inductance from the IC chip to the substrate to the power supply can be reduced. Therefore, power shortage at an initial operation decreases, so that the shortage of power becomes unlikely to occur and consequently, even if an IC chip in a high frequency region is mounted, no malfunction or error is induced at the initial operation. Further, because the conductive layers 34E, 16E are used as the ground layer, noise does not overlap a signal of the IC chip or supply of power, thereby preventing malfunction or error. Because power accumulated in the capacitor can be used subsidiarily with the capacitor being mounted, the shortage of power becomes unlikely to occur.

Figure 12:
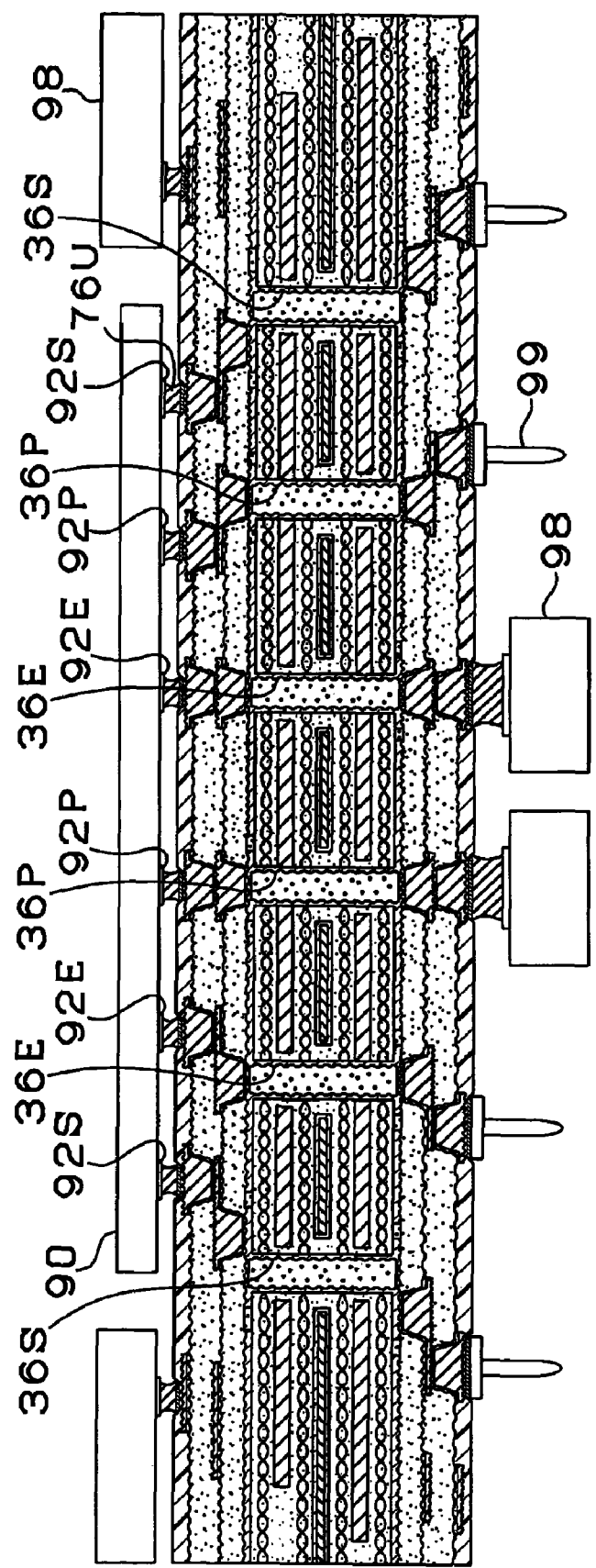
FIG. 12 is a cross-sectional view for the multilayer printed wiring board according to modified example of Embodiment 1.

FIG. 12 shows a modification of the first embodiment. According to the modification, the capacitor 98 is disposed just below the IC chip 90 and a conductive connection pin 99 is attached to the lower surface side. If the capacitor 98 is disposed just below the IC chip 90, the effect of making difficult the shortage of power is remarkable. The reason is that just below the IC chip, the wiring length on the multilayer printed wiring board can be shortened.

FIG. 10(B) shows the arrangement of the through holes according to the modification of the first embodiment. FIG. 11(B) is an explanatory diagram showing a portion II indicated with dotted line in FIG. 10(B) in enlargement. According to the modification of the first embodiment, the power through holes 36P and the ground through holes 36E are disposed in the staggered formation at adjacent positions. Such a configuration cancels out electromotive forces induced in the X direction and Y direction.

As described with reference to FIG. 11(B), as for the through holes 36P, 36E disposed in the staggered formation, the ground through holes GND1, GND2, GND3, GND4 are disposed around a single power through hole VCC. At this time, the ground through holes GND are preferred to be disposed at the same distance to the power through hole VCC. Due to this structure, electromotive force induced in a single ground through hole GND (or power through hole VCC) is cancelled out by one or more power through holes VCC (or ground through hole GND). As a result, the mutual inductance of the through hole can be reduced and because an influence of the induced electromotive force is received, malfunction or delay become unlikely to occur.

In Embodiment 1, the multilayer core substrate 30 has the thick conductor layers 16P and 16E on the inner layer and the thin conductor layers 34P and 34E on the surface of the substrate 30, and the inner layer conductor layers 16P and 16E and the surface layer conductor layers 34P and 34E are employed as the power supply conductor layers and the grand conductor layers, respectively. Namely, even if the thick conductor layers 16P and 16E are arranged on the inner layer side of the substrate 30, the resin layers covering the conductor layers are formed. Due to this, it is possible to cancel irregularities derived from the conductor layers and thereby flatten the surface of the multilayer core substrate 30. Therefore, even if the thin conductor layers 34P and 34E are arranged on the surfaces of the multilayer core substrate 30 so as not to generate waviness on the conductor layers 58 and 158 of the respective interlayer resin insulating layers 50 and 150, it is possible to secure sufficient thickness as that of the conductor layers of the core by the sum of the thicknesses of the conductor layers 16P and 16E on the inner layer. Since no waviness occurs, no problem occurs to the impedances of the conductor layers on the interlayer insulating layers. By employing the conductor layers 16P and 34P as the power supply conductor layers and the conductor layers 16E and 34E as the grand conductor layers, it is possible to improve the electric characteristics of the multilayer printed wiring board.

That is to say, the thicknesses of the conductor layers 16P and 16E on the inner layer of the core substrate are set larger than those of the conductor layers 58 and 158 on the interlayer insulating layers 50 and 150. By doing so, even if the thin conductor layers 34E and 34P are arranged on the surfaces of the multilayer core substrate 30, it is possible to secure sufficient thickness as that of the conductor layers of the core by adding the thicknesses of the thick conductor layers 16P and 16E on the inner layer. The thickness ratio of the conductor layers preferably satisfies 1<(sum thickness of each inner conductor layer of core/conductor layer of insulating layer)≦40. More preferably, the thickness ratio satisfies 1.2≦(sum thickness of each inner conductor layer of core/conductor layer of insulating layer)≦20.

The multilayer core substrate 30 is constituted so that the conductor layers 16P and 16E as inner layer is formed on each surface of an electrically isolated metallic plate 12 through a resin layer 14 and so that the conductor layers 34P and 34E on the surface layer is formed outside of the conductor layers 16P and 16E as the inner layer through the resin layer 18. By arranging the electrically insulated metallic plate 12 on the central portion of the substrate, it is possible to secure sufficient mechanical strength. Further, by forming the conductor layers 16P and 16E on the inner layer of the both surfaces of the metallic plate 12 through the resin layers 14, respectively and the conductor layers 34P and 34E on the surface layer on the outside of the conductor layers 16P and 16E as the inner layer on the both surfaces of the metallic plate 12 through the resin layers 18, respectively, it is possible to impart symmetry to the both surfaces of the metallic plate 12 and to prevent the occurrence of warps, waviness and the like in a heat cycle and the like.

Next, a method for manufacturing the multilayer printed wiring board 10 shown in FIG. 8 will be described with reference to FIGS. 1 to 7.

(1) Formation of Metallic Layer

Openings 12a are provided in an inner layer metallic layer (metallic plate) 12 having a thickness of 50 to 400 μm as shown in FIG. 1(A) to penetrate the front and rear surfaces of the layer 12 (FIG. 1(B)). As the material of the metallic layer, a material containing a mixture of copper, nickel, zinc, aluminum, iron and the like can be used. The openings 12a are formed by punching, etching, drilling, a laser or the like. Depending on cases, metallic films 13 may be coated on the entire surfaces of the metallic layer 12 having the openings 12a formed therein by electroplating, electroless plating, substitutional plating or sputtering (FIG. 1(C)). The metallic plate 12 may comprise a single layer or a plurality of layers of two or more layers. In addition, the metallic films 13 preferably have curves. The curves can eliminate points at which stresses are concentrated and make it more difficult to cause defects such as cracks and the like around the points.

(2) Formation of Insulating Layers on Inner Layer

Insulating resin is used to cover the entire surfaces of the metallic layer 12 and fill up the openings 12a. For example, the metallic plate 12 is put between resin films in a B stage state of a thickness of about 30 to 200 μm, the resin films are thermally pressed and hardened, whereby insulating rein layers 14 can be formed (FIG. 1(D)). Depending on cases, the insulating rein layers 14 may be formed out of films after applying resin, applying resin and press-fitting the resin films or applying the resin only to the opening portions.

As the material of the insulating resin layers 14, a prepreg having a core material such as glass cloth impregnated with thermosetting resin such as polyimide resin, epoxy resin, phenol resin or BT resin is preferable. The other resin may be used.

(3) Bonding of Metallic Foils

Metallic layers 16α on the inner layer are formed on the both surfaces of the metallic layer 12 covered with the resin layers 14, respectively (FIG. 1(E)). By way of example, metallic foils having a thickness of 12 to 275 μm are built on the both surfaces thereof. As an alternative to the method for forming the metallic foils, a one-sided copper-clad laminate is built up on each surface of the metallic layer 12. The laminate can be formed on the metallic foils by plating or the like.

(4) Formation of Circuits of Metallic Layer on the Inner Layer

Two or more layers may be formed. The metallic layer may be formed by the additive method.

Through a denting method, etching steps and the like, conductor layers 16P and 16E on the inner layer are formed from the inner layer metallic layer 16α (FIG. 1(F)). The inner layer conductor layers are formed to have thicknesses of 10 to 250 μm.

(5) Formation of Insulating Layers as Outer Layers

Insulating resin is used to cover the entire surfaces of the inner layer conductor layers 16P and 16E and fill up the gaps between the circuits of outer layer metal. By way of example, outer layer insulating resin layers 18 are formed by putting the metallic plate between resin films in a B stage state of a thickness of about 30 to 200 µm, thermally press-fitting and hardening the resin films (FIG. 2(A)). Depending on cases, the outer layer insulating resin layers 18 may be formed out of films after applying resin, applying resin and press-fitting the resin films or applying the resin only to the opening portions. By applying pressure, it is possible to flatten the surfaces of the layers 18.

(6) Bonding of Outermost Layer Metallic Foils

Outermost metallic layers 34 α are formed on the both surfaces of the substrate covered with the outer layer insulating resin layers 18 (FIG. 2(B)). By way of example, metallic foils having a thickness of 12 to 275 µm are built up on the both surfaces of the substrate. As an alternative to the method for forming the metallic foils, one-sided copper-clad laminates are built up. Two or more layers of the laminates may be formed on the metallic foils. The metallic layers may be formed by the additive method.

(7) Formation of through Holes

Pass-through holes 36α for through holes having opening diameter of 50 to 500 µm are formed to penetrate the front and rear surfaces of the substrate (FIG. 2(C)). As a formation method, the holes are formed by drilling, a laser or a combination of drilling and the laser. (The holes are opened in the outermost insulating layers by the laser, and then may be penetrated through the substrate by drilling while using the holes opened by the laser as target marks.) The forms of the holes are preferably those having linear sidewalls. Depending on cases, the holes may be tapered. The distance (pitch) between the through holes is 60 to 600 µm.

To secure the conductive properties of the through holes, it is preferable to form plated films 22 in the respective pass-through holes 36α for the through holes and roughen the surfaces of the plated films 22 (FIG. 2(D)), and then to fill the holes with resin filler 23 (FIG. 2(E)). As the resin filler, either an electrically insulated resin material (e.g., a resin material containing a resin component, hardening agent, particles and the like) or a conductive material holding electrical connection by metallic particles (e.g., a conductive material containing metallic particles such as gold or copper particles, a resin material, hardening agent and the like) can be used.

As plating, electroplating, electroless plating, panel plating (electroless plating and electroplating) or the like may be performed. The plated films 22 are formed by plating metals containing copper, nickel, cobalt, phosphorus or the like. The thicknesses of the plated metals are preferably 5 to 30 µm.

The resin filler 23 filled in the pass-through holes 36a for the through holes is preferably made of an insulating material comprising a resin material, hardening agent, particles and the like. As the particles, inorganic particles such as silica or alumina particles can be used solely, metallic particles such as gold, silver or copper particles can be used solely, resin particles can be used solely or the inorganic particles, the metallic particles and the resin particles can be mixed together. The particles equal in particle size from 0.1 to 5 µm or different in particle size from 0.1 to 5 µm can be mixed. As the resin material, thermosetting resin such as epoxy resin (e.g., bisphenol type epoxy resin or novolac type epoxy resin and the like) or phenol resin, ultraviolet setting resin having a photosensitive property, thermoplastic resin or the like may be used solely or mixed together. As the hardening agent, imidazole based hardening agent, amine based hardening agent or the like can be used. Alternatively, hardening agent containing hardening stabilizer, reaction stabilizer, particles and the like may be used. In the latter case, the resin filler is replaced by conductive paste made of a conductive material comprising metallic particles, a resin component, hardening agent and the like. Depending on cases, metallic films having a conductive property may be formed on the surface layers of an insulating material such as solder or insulating resin. It is also possible to fill the pass-through holes 36a for through holes with plated members. Since the conductive paste is hardened and contracted, depressed portions are sometimes formed on the surface layers.

The formed through holes are grand through hole 36E and power through holes 36P, as mentioned with referring to FIG. 11(A), are placed as the lattice arrangement.

(8) Formation of Outermost Layer Conductor Circuits

Cover plated members 25 may be formed right on the through holes 36S, 36E, 36P by coating plated films on the entire surfaces of the substrate (FIG. 3(A)). Thereafter, outer layer conductor circuits 34, 34P and 34E are formed through the denting method, etching steps and the like (FIG. 3(B)). As a result, the multilayer core substrate 30 is completed.

At this time, although not shown in the drawings, the electrical connection of the outer conductor circuits to inner conductor layers 16P, 16E and the like of the multilayer core substrate may be established by via holes, blind through holes or blind via holes.

(9) The multilayer core substrate 30 on which the conductor circuits 34 have been formed thereon is subjected to a blackening treatment and a reduction treatment, thereby forming roughened surfaces 34B on the entire surfaces of the conductor circuits 34 and the conductor layers 34P and 34E (FIG. 3(C)).

(10) Layers of the resin filler 40 are formed on the conductor circuit unformed portions of the multilayer core substrate 30 (FIG. 4(A)).

(11) The one surface of the substrate which has been subjected to the above treatments is polished by belt sander polishing or the like so as not to leave the resin filler 40 on the outer edges of the conductor layers 34P and 34E, and then the entire surfaces of the conductor layers 34P and 34E (including the land surfaces of the through holes) are further polished by buffing or the like so as to eliminate scratches caused by the former polishing. A series of polishing operations are similarly conducted to the other surface of the substrate. Next, the resin filler 40 is hardened by heat treatments at 100° C. for 1 hour and 150° C. for 1 hour (FIG. 4(B)).

The resin filler may not be filled between the conductor circuits. In that case, using resin layers such as interlayer insulating layers, the insulating layers are formed and the portions between the conductor circuits are filled up.

(12) Etchant is sprayed onto the both surfaces of the multilayer core substrate 30 and the surfaces of the conductor circuits 34 and the conductor layers 34P and 34E and the land surfaces and inner walls of the through holes 36S, 36E, 36P are subjected to etching or the like, thereby forming roughened surfaces 36β on the entire surfaces of the conductor circuits (FIG. 4(C)).

(13) Resin films 50γ for interlayer resin insulating layers are mounted on the both surface of the multilayer core substrate 30, respectively, temporarily press-fitted and cut, and then bonded onto the substrate using the vacuum laminator, thereby forming interlayer resin insulating layers (FIG. 5(A)).

(14) Thereafter, through a mask having pass-through holes having a thickness of 1.2 mm formed therein, openings 50a for via holes are formed to have a diameter of 80 µm in the interlayer resin insulating layers 50 by a CO2 gas laser having wavelength of 10.4 μm under conditions of a beam diameter of 4.0 mm, a top hat mode, a pulse width of 7.9 microseconds, the pass-through hole diameter of the mask of 1.0 mm and one shot (FIG. 5(B)).

(15) The multilayer core substrate 30 is immersed in a solution containing 60 g/l of permanganic acid at 80° C. for 10 minutes to form roughened surfaces 50α on the surfaces of the interlayer resin insulating layers 50 including the inner walls of the via hole openings 50a (FIG. 4(C)). The roughened surfaces are formed to have a thickness between 0.1 to 5 μm.

(16) Next, the multilayer core substrate 30 which has been subjected to the above-stated treatments is immersed in neutralizer (manufactured by Shipley Corporation) and then washed. Further, a palladium catalyst is added to the surfaces of the roughened substrate (a roughening depth of 3 μm), thereby attaching catalyst nuclei to the surfaces of the interlayer resin insulating layers and the inner wall surfaces of the via hole openings.

(17) The substrate to which the catalyst is attached is immersed in an electroless copper plating aqueous solution and electroless copper plated films having a thickness of 0.6 to 3.0 μm are formed on the entire roughened surfaces, thereby obtaining the substrate having electroless copper plated films 52 formed on the surfaces of the interlayer resin insulating layers 50 including the inner walls of the via hole openings 50a (FIG. 4(D)).

(18) Commercially available dry films are bonded to the substrate on which electroless copper plated films 52 are formed, a mask is put on the substrate, the substrate is developed and plating resists 54 are thereby provided (FIG. 6(A)). The plating resists having a thickness of 10 to 30 μm are used.

(19) Next, the multilayer core substrate 30 is electroplated, thereby forming electroplated copper films 56 having a thickness of 10 to 20 μm are formed on portions in which the plating resists 54 are not formed, respectively (FIG. 6(B)).

(20) After peeling off the plating resists with 5% KOH, the electroless plated films under the plating resist are etched, molten and removed with a solution mixture of sulfuric acid and hydrogen peroxide, thus forming independent conductor circuits 58 and via holes (filled-via) 60 (FIG. 6(C)).

(21) Next, the same treatment as that of (12) is conducted to form roughened surfaces 58α and 60α on the surfaces of the conductor circuits 58 and via holes 60. The upper conductor circuits 58 are formed to have a thickness of 10 to 25 μm. In this example, the upper conductor circuits 58 have a thickness of 15 μm (FIG. 6(D)).

(22) The steps (14) to (21) stated above are repeated, thereby forming further upper layer conductor circuits 158, via holes 160, interlayer resin insulating layers 150, and a multilayer wiring board is obtained (FIG. 7(A)).

(23) Next, after the above-stated solder resist composition 70 is coated on each surface of the multilayer wiring board by a thickness of 12 to 30 μm, and dried under conditions of 70° C. for 20 minutes and 70° C. for 30 minutes (FIG. 7(B)), a photomask on which a pattern of solder resist opening portions are drawn and which has a thickness of 5 mm, is fixedly attached to each solder resist layer 70, exposed with ultraviolet rays of 1000 mJ/cm², and developed with a DMTG solution, thereby forming opening portions 71 having a diameter of 200 μm (FIG. 7(C)). Further, heat treatments are conducted at 80° C. for 1 hour, at 100° C. for 1 hour, at 120° C. for 1 hour, and at 150° C. for 3 hours, respectively, to harden the solder resist layers, thus forming solder resist pattern layers each having opening 71 and a thickness of 10 to 25 μm.

(24) Next, the substrate on which the solder resist layers 70 are formed is immersed in an electroless nickel plating solution, thereby forming nickel plated layers 72 having a thickness of 5 μm on the opening portions 71, respectively. Furthermore, the substrate is immersed in an electroless gold plating solution, thereby forming gold plated layers 74 having a thickness of 0.03 μm on the respective nickel plated layers 72 (FIG. 7(D)). Alternatively, a single tin or noble metal (gold, silver, palladium, platinum or the like) layer may be formed in stead of the nickel-gold layers.

(25) Thereafter, tin-lead containing solder paste is printed on each opening 71 of the solder resist layer 70 on one surface of the substrate on which surface the IC chip is mounted, tin-antimony containing solder paste is further printed on each opening on the other surface of the substrate, and external terminals are formed by conducting reflow at 200° C., thereby manufacturing a multilayer printed wiring board including solder bumps 76U, 76D (FIG. 8).

Second Embodiment

3-Layer Multi-Layer Core Substrate

The multi-layer printed wiring board according to the second embodiment will be described with reference to FIG. 13.

According to the first embodiment described with reference to FIG. 8, the core substrate is composed of four layers (ground layers 16E, 34E: 2, power layers 16P, 34P: 2). Contrary to this, according to the second embodiment, as shown in FIG. 13, the multi-layer core substrate 30 is composed of three layers (ground layers 34E, 34E: 2, power layer 15P: 1).

Figure 13:
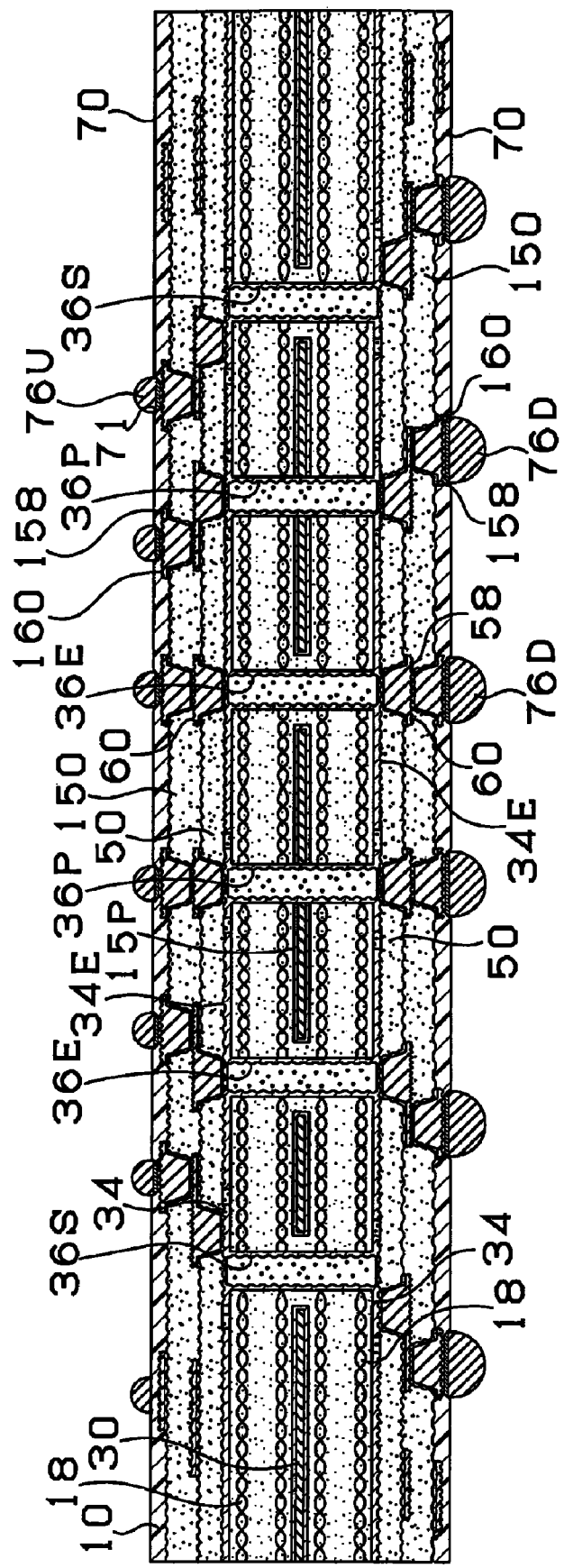
FIG. 13 is a cross-sectional view for the multilayer printed wiring board according to Embodiment 2.

In the multi-layer printed wiring board 10 according to the second embodiment, as shown in FIG. 13, the conductor circuit 34 and the ground conductive layer 34E are formed on each of the front surface and the rear surface of the multi-layer core substrate 30 and the power conductive layer 15P is formed inside the core substrate 30. The ground conductive layer 34E is formed as a ground plain layer and the power conductive layer 15P is formed as a power plain layer. The ground through hole 36E is connected to the ground conductive layers 34E on the both surfaces of the core substrate and the power through hole 36P is connected to the power conductive layer 15P in the center of the core substrate. A signal is connected to the both surfaces of the multi-layer core substrate 30 via the signal through hole 36S. On the ground conductive layer 34E are disposed the interlayer resin insulating layer 50 in which the via hole 60 and the conductor circuit 58 are formed and the interlayer resin insulating layer 150 in which the via hole 160 and the conductor circuit 158 are formed. The solder resist layer 70 is formed above the via hole 160 and the conductor circuit 159 and the bumps 76U, 76D are formed in the via hole 160 and the conductor circuit 158 via the opening portion 71 of the solder resist layer 70.

According to the second embodiment also, like the first embodiment described with reference to FIGS. 10(A), 10(B), the power through holes 36P and the ground through holes 36E are disposed in the grid formation or in the staggered formation so as to reduce mutual inductance.

The conductor circuit 34 and the conductive layer 34E are formed on the core substrate 30 and the conductive layer 15P is formed inside the core substrate. On the other hand, the conductor circuit 58 is formed on the interlayer resin insulating layer 50 and the conductor circuit 158 is formed on the interlayer resin insulating layer 150. The conductive layer 34E on the core substrate is formed in the thickness of 1 to 250 μm and the conductive layer 15P taking as a power layer formed inside the core substrate is formed in the thickness of 1 to 250 μm. The thickness of the conductive layer in this case is total values of the thicknesses of the power layers in the core substrate. It means that this is sum of both the conductive layer 15P as the inner layer and the conductive layer 34E as the front surface layer. This does not mean sum of layers taking as a signal line. By summing up the thicknesses of the three layers, the three conductive layers 34E, 15P, the same effect as the first embodiment is obtained. The thickness of the power layer may exceed the above-described range.

Modification of the Second Embodiment

Figure 14:
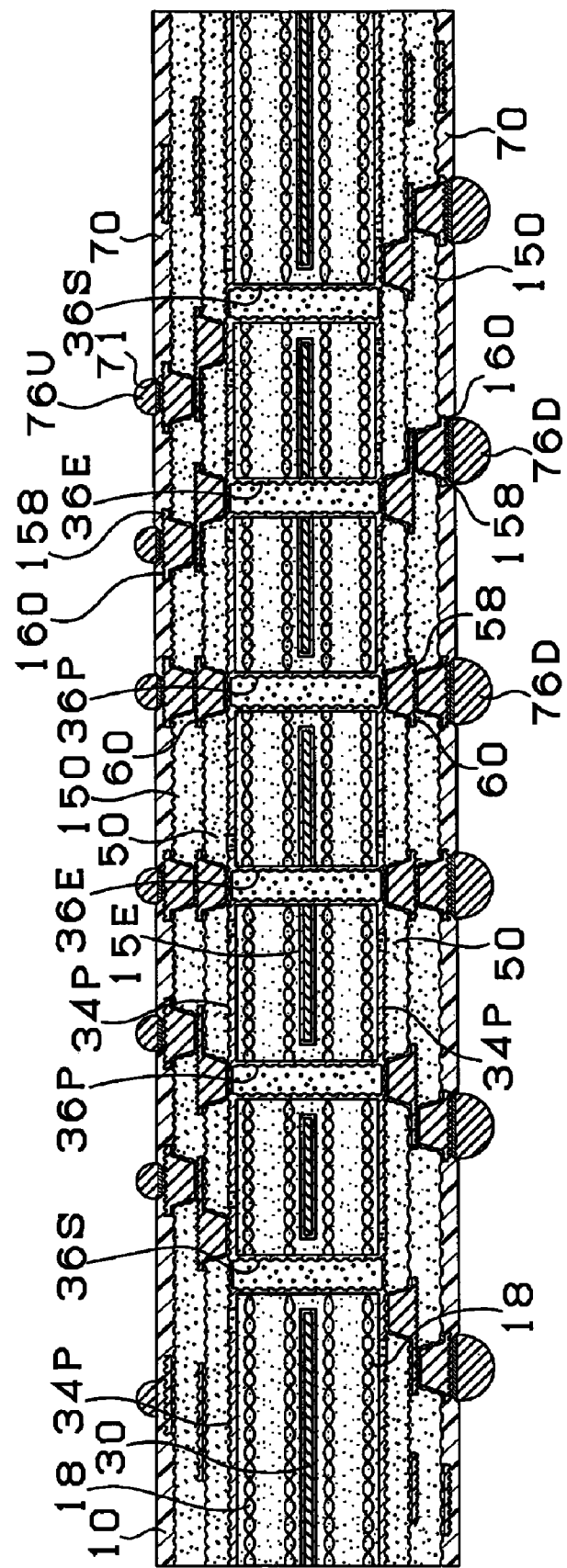
FIG. 14 is a cross-sectional view for the multilayer printed wiring board according to modified example of Embodiment 2.

FIG. 14 shows a sectional view of the multi-layer printed wiring board according to the modification of the second embodiment. Although according to the second embodiment described with reference to FIG. 13, the multi-layer core substrate 30 is composed of three layers (ground layers 34E, 34E: 2, power layer 15P: 1), according to the modification of the second embodiment, the multi-layer core substrate 30 is composed of three layers (ground layer 15E: 1, power layers 34P, 34P: 2).

As shown in FIG. 14, in the multi-layer printed wiring board 10 according to the second embodiment, the conductor circuit 34 and the power conductive layer 34P are formed on the front surface and rear surface sides of the multi-layer core substrate 30 while the ground conductive layer 15E is formed inside the core substrate 30. The ground conductive layer 15E is formed as a ground plain layer and the power conductive layers 34P, 34P are formed as a power plain layer. The ground through hole 36E is connected to the ground conductive layers 15E, 15E in the center of the core substrate and the power through hole 36P is connected to the power conductive layers 34P, 34P on both sides of the core substrate. A signal is connected to both faces of the multi-layer core substrate 30 via the signal through hole 36S. Above the power conductive layer 34P are disposed the interlayer resin insulating layer 50 in which the via hole 60 and the conductive circuit 58 are formed and the interlayer resin insulating layer 150 in which the via hole 160 and the conductor circuit 158 are formed.

According to the modification of the second embodiment also, like the first embodiment described above with reference to FIGS. 10(A), (B), the power through hole 36P and the ground through hole 36E are disposed in the grid formation or in the staggered formation so as to reduce mutual inductance. According to the modification of the second embodiment also, the three conductive layers 34P, 34P, 15E in the multi-layer core substrate 30 and the conductor circuits 58, 158 in the interlayer resin insulating layers 50, 150 are formed in the same thickness as the second embodiment so as to secure the same effect.

Third Embodiment

Glass Epoxy Resin Substrate

Figure 15:
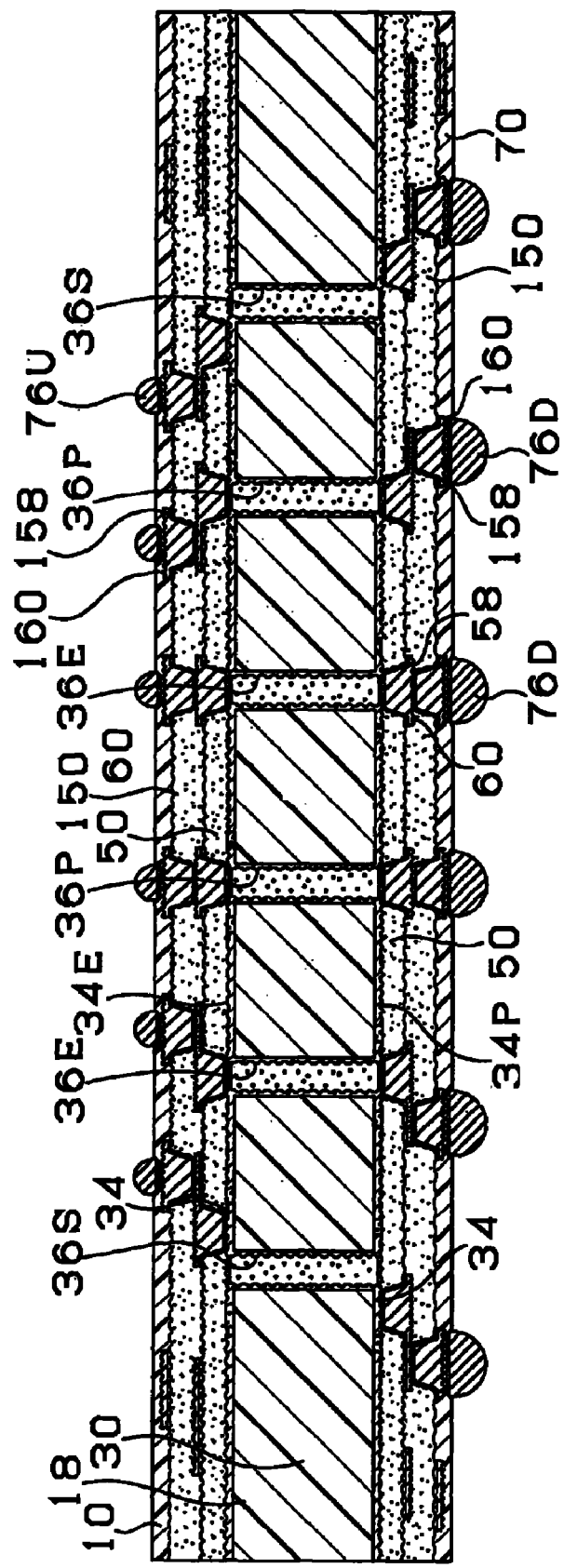
FIG. 15 is a cross-sectional view for the multilayer printed wiring board according to Embodiment 3.
Figure 18:
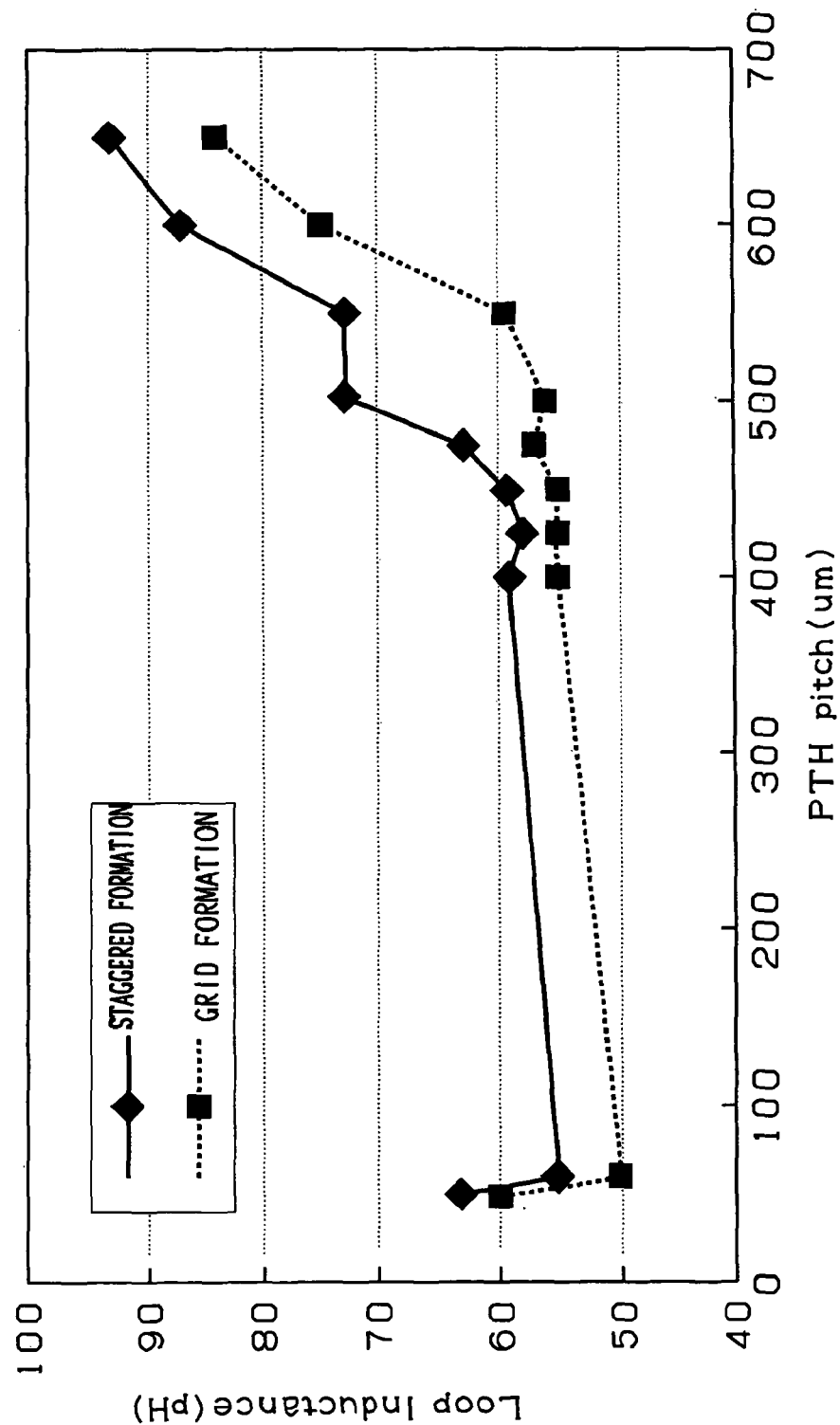
FIG. 18 is a graph showing a measured result of the loop inductance as to the lattice arrangement, the plover arrangement and random arrangement of through holes.

Although in the first and second embodiments, the multi-layer core substrate 30 is employed, according to the third embodiment, a single core substrate 30 is used as shown in FIG. 15 and the conductive layers on both sides of the core substrate are formed as the power layer and ground layer. That is, the ground layer 34E is formed on top of the core substrate 30 and the power layer 34P is formed on the bottom thereof. The front surface and rear surface of the core substrate 30 are connected via the power through hole 36P, the ground through hole 36E and the signal through hole 36S. Above the conductive layers 34P, 34E are disposed the interlayer resin insulating layer 50 in which the via hole 60 and the conductive layer 58 are formed and the interlayer resin insulating layer 150 in which the via hole 160 and the conductor circuit 158 are formed.

According to the third embodiment also, like the first embodiment described with reference to FIGS. 10(A), (B), the power through hole 36P and the ground through hole 36E are disposed in the grid formation or in the staggered formation so as to reduce mutual inductance.

The conductive layers 34P, 34E on the core substrate 30 is formed in the thickness of 1 to 250 μm, and the conductor circuit 58 on the interlayer resin insulating layer 50 and the conductor circuit 158 on the interlayer resin insulating layer 150 are formed in the thickness of 5 to 25 μm (preferably, 10 to 20 μm).

In the multi-layer printed wiring board of the third embodiment, the thicker the power layer (conductive layer) 34P and the conductive layer 34E of the core substrate 30, the stronger the core substrate is. Thus, even if the thickness of the core substrate itself is decreased, warpage and stress generated can be relaxed by the substrate itself. Further, by thickening the conductive layers 34P, 34E, the volume of the conductor itself can be increased. By increasing the volume, resistance of the conductor can be reduced.

Further, by using the conductive layer 34P as a power layer, supply capacity of power to the IC chip can be improved. Thus, when the IC chip is mounted on the multi-layer printed wiring board, loop inductance from the IC chip to the substrate to the power supply can be reduced. As a result, shortage of power at an initial operation decreases, so that the shortage of power becomes unlikely to occur. For the reason, even if an IC chip in a high frequency region is mounted, the malfunction or error in the initial startup is never induced. Further, by using the conductive layer 34E as a ground layer, overlapping of noise on signals of the IC chip and supply of power is eliminated thereby preventing the malfunction or error.

COMPARATIVE EXAMPLE

The comparative example is almost the same as the first embodiment except that the ground through hole and the power through hole are formed at a position in which they do not adjoin each other. That is, the ground through holes and the power through holes were formed at random and the shortest distance (through hole pitch) between the ground through hole and the power through hole were set in eight kinds from 80 to 650 μm as shown in FIG. 16. The same Figure shows the through hole diameter. These are disposed at random as described in FIG. 16.

A first reference example is almost the same as the first embodiment except that the distance between the ground through hole and the power through hole was over 600 μm. As an example thereof, the distance was set to 650 μm.

As a second reference example, almost the same piece as the third embodiment was produced except that the distance between the ground through hole and the power through hole was over 600 μm. As an example thereof, a piece was produced in a condition in which the distance was set to 650 μm. The loop inductance became the same as the first reference example.

As a third reference example, almost the same piece as the first embodiment was produced except that the thickness of the core substrate was decreased for achieving multiple layers and the diameters of the ground through hole and power through hole were set to 25 μm while the distance between the ground through hole and the power through hole was set to less than 60 μm. As an example thereof, a piece was produced in a condition in which the distance was set to 50 μm. The sum of the thicknesses of respective conductive layers of the multi-layer core substrate is the same as the first embodiment.

FIG. 16 shows a result of measurement of each loop inductance in case where the through holes in the multi-layer printed wiring board of the first embodiment are disposed in the grid formation (thick copper), a case where the through holes are disposed in the staggered formation as a modification of the first embodiment (thick copper) and a case where the through holes are disposed at random with the sum of the thicknesses of respective conductive layers in the multi-layer core substrate of the first embodiment set to the same as the thickness of the conductive layer on the interlayer insulating layer, as the fourth reference example and comparative example. The value of the loop inductance is a value per 2.5 mm².

The grid formation (thick copper) or the staggered formation (thick copper) [a structure in which the ground through hole and the power through hole adjoin each other] can reduce the loop inductance more than the random formation (a structure in which the ground through hole and the power through hole do not adjoin) even if the through hole pitch is changed. As a consequence, delay is suppressed, so that power supply time to a transistor of the IC is reduced. Even if an IC exceeding 3 GHz is mounted, the transistor is not short of power.

The grid formation reduces the loop inductance more than the staggered formation regardless of the through hole pitch. Thus, it can be said to be superior in terms of electric characteristic. It is evident from FIG. 16 that the loop inductance is lower if the ground through holes 36E and the power through holes 36P are disposed diagonally.

If comparing the grid formation (thick copper) of FIG. 16 with the fourth reference example, in the case of the same grid formation, a case where the sum of the thicknesses of the respective conductive layers in the multi-layer core substrate was larger provided a more excellent value under any through hole pitch. This reason is estimated to be that the through hole and the side wall of the conductive layer cancels out inductances together.

By changing the through hole pitch, the loop inductance was calculated by simulation. FIG. 17(B) indicates its result. The value of the loop inductance here is a value per 2.5 mm².

Further, reliability test was carried out on a substrate in the grid formation and the staggered formation at each through hole pitch under high-temperature, high-humidity condition (carried out at 85° C., 85 wt % in humidity for 500 hours). FIG. 17(A) shows whether or not there is any crack in the insulating layer of the through hole and a resistance measurement result in conductivity test. As evident from FIG. 17(B), although loop inductance decreased if the through hole pitch was reduced, if it is less than 60 μm, conversely the loop inductance rose. The reason is estimated to be that the loop inductance rose because the through hole pitch at the same potential narrowed or that self inductance increased because the through hole diameter was reduced.

If the loop inductance is large, supply of power to the transistor of the IC is delayed. If the driving frequency of the IC is accelerated, time taken for the transistor to make a next ON from a ON shortens. If the voltage of the transistor is insufficient, the transistor does not operate.

If the loop inductance drops to 75 pH or less, the voltage is restored to a voltage which operates the transistor of the IC properly until it turns ON next even if with the IC chip whose frequency is 3 GHz loaded and simultaneous switching is repeated, thereby hardly causing malfunction. In this case, as evident from FIG. 16, the loop inductance never drops to 75 pH or less under the random formation. Malfunction is likely to occur under the random formation. As a result of mounting an IC whose frequency was 1, 3, 5 GHz on a random formation printed wiring board and repeating the simultaneous switching 10,000 times, the ICs having 3 GHz, 5 GHz malfunctioned although the IC having 1 GHz operated properly.

In case of the grid formation, the through hole pitch is desired to be 600 μm or less. This range can reduce the loop inductance to a specific level (75 pH or less). Further, if the through hole pitch is between 80 and 600 μm, the loop inductance rests within that given loop inductance region and at the same time, reliability can be secured.

In case of the staggered formation, the through hole pitch is desired to be 550 μm or less. Such a range can reduce the loop inductance to the specific level (75 pH or less). Further, if the through hole pitch is between 80 and 550 μm, the loop inductance rests within that given loop inductance and at the same time, reliability can be secured.

If the loop inductance drops to less than 60 pH, even if with an IC chip whose frequency is 5 GHz loaded and simultaneous switching is repeated, malfunction hardly occurs. In this case, as evident from FIG. 16, in case of the grid formation, the through hole pitch is desired to be between 80 and 550 μm. Such a range can reduce the loop inductance level to less than 60 pH. Then, if the through hole pitch is between 80 and 550 μm, the loop inductance rests within that given loop inductance region and at the same time, reliability can be secured.

In case of the staggered formation, as evident from FIG. 16, the through hole pitch is desired to be between 80 and 450 μm. Such a range can reduce the through inductance level to less than 60 pH. Then, if the through hole pitch is between 80 and 450 μm, the loop inductance rests within that given loop inductance region and at the same time, reliability can be secured.

Further, if the loop inductance drops to 55 pH or less, malfunction hardly occurs even if the simultaneous switching is repeated regardless of the frequency of the IC chip. According to the result of FIG. 16, if in the case of the grid formation, the through hole pitch is between 80 and 450 μm, such a result is generated. Then, if the through hole pitch is between 80 and 450 μm, the loop inductance rests within that given loop inductance and at the same time, reliability can be secured. On the other hand, according to the result of simulation, such a result is provided if the through hole pitch is between 60 and 450 μm.

Figure 19:
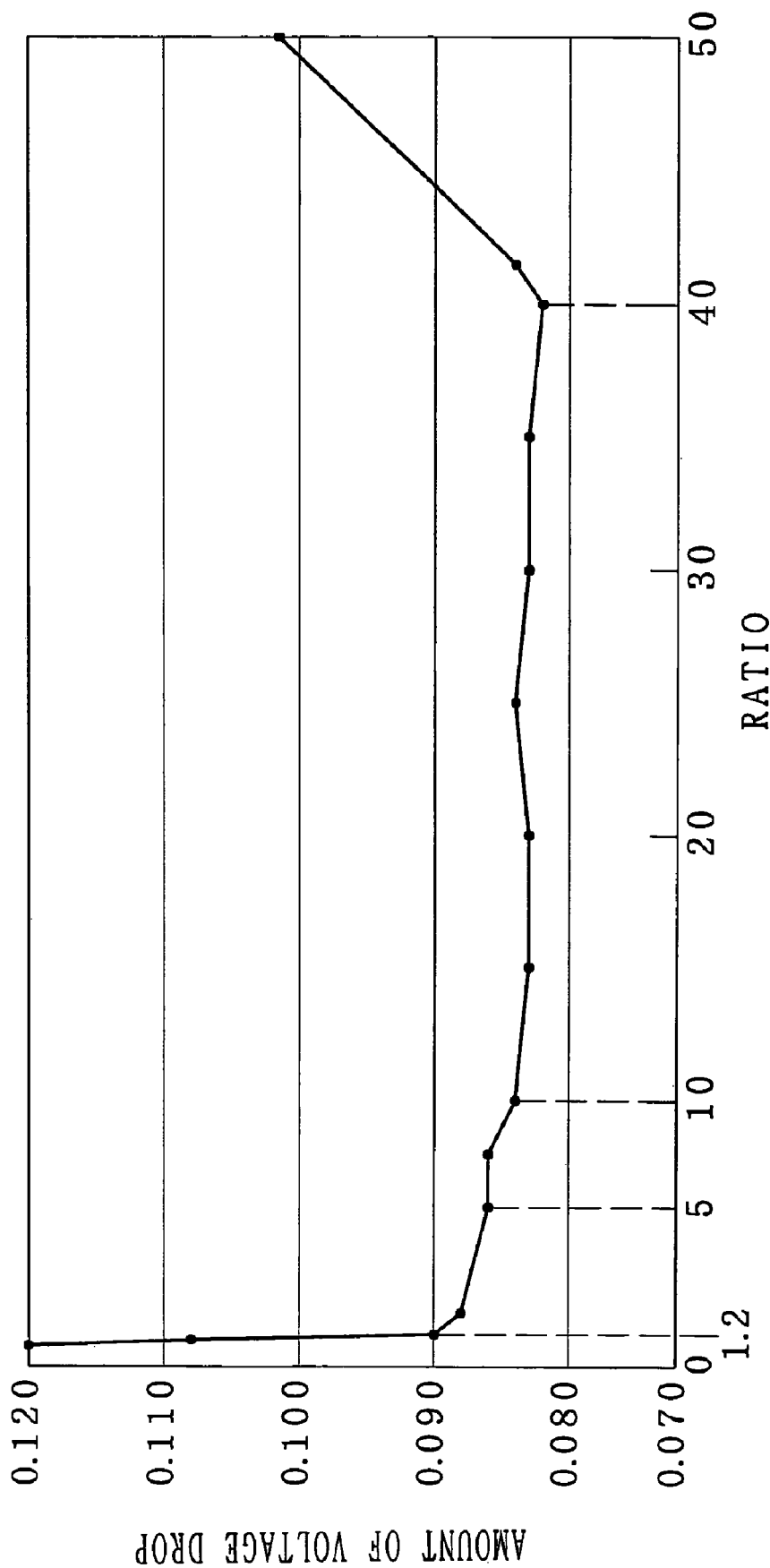
FIG. 19 is a graph showing a maximum voltage drop quantity (V) for (a ratio of sum thickness of each conductive layers of multilayer core/thickness of conductive layer on interlayer insulating layer).

FIG. 19 shows a result of measuring the amount of voltage drop when a printed wiring board was manufactured by changing the sum of the thicknesses of respective conductive layers in the multi-layer core substrate and with the IC chip whose frequency was 3.1 GHz loaded, the printed wiring board was started by supplying the same amount of power. Because the voltage of the IC could not be measured directly through the IC, the printed wiring board was provided with a measuring circuit. (ratio of sum of the thicknesses of conductive layers in the multi-layer core substrate/thickness of the conductive layer on interlayer insulating layer) is set on the abscissa axis and a maximum voltage drop (V) is set on the ordinate axis.

If when the voltage of power is 1.0 V, it is within deflection allowance range ±10%, it comes that the behavior of the voltage is stable, thereby never inducing the malfunction of the IC chip. That is, if the amount of voltage drop is 0.1 V or less, it comes that any malfunction of the IC chip by voltage drop is never induced. For the reason, the ratio of (sum of thicknesses of conductive layers in the multi-layer core substrate/thickness of conductive layer on interlayer insulating layer) exceeds 1.2. Further, if 1.2≦(sum of thicknesses of conductive layers in the multi-layer core substrate/thickness of conductive layer on interlayer insulating layer)≦40, the numeric value tends to decrease and thus, its effect is easy to obtain. On the other hand, if 40<(sum of thicknesses of conductive layers in the multi-layer core substrate/thickness of conductive layer on interlayer insulating layer), the amount of voltage drop is rising. Because current likely flows on the front surface, if the conductive layer is thick, it is estimated that the voltage drop increases because its moving distance in the thickness direction lengthens.

Further, if 5.0<(sum of thicknesses of conductive layers in the multi-layer core substrate/thickness of conductive layer on interlayer insulating layer)≦40, the amount of voltage drop is almost the same, meaning that the voltage is stable. That is, it can be said that this range is most desirable ratio range.

If the thickness of the conductor is too small, peeling occurs in a via hole connection portion, whereby the reliability dropping. However, if the ratio of the sum of thicknesses of the conductive layers in the multi-layer core substrate/thickness of the conductive layer on the interlayer insulating layer exceeds 1.2, the reliability is raised. On the other hand, if the ratio of the sum of thicknesses of the conductive layers in the multi-layer core substrate/thickness of the conductive layer on the interlayer insulating layer exceeds 40, the reliability drops because of fault in the conductor circuit on the upper layer (for example, adhesion drops due to generation of stress in the conductor circuit on the upper side or swelling).

According to the present invention, the ground through holes and the power through holes are disposed in the grid formation or in the staggered formation and because the ground through hole and the power through hole adjoin each other so that the directions of electromotive forces generated in each are opposite, the induced electromotive forces in the X direction and Y direction cancel out each other. Thus, the speed of supply of power to the transistor of the IC is accelerated. For the reason, malfunction is eliminated. If the printed wiring board of the present invention is used, even if the transistor of the IC repeats ON/OFF rapidly, the potential of the transistor never drops.

Because the sum of the thicknesses of the conductive layers in the multi-layer core substrate is larger than the thickness of the conductive layer on the interlayer insulating layer so that the thickness of the conductive layer in the inner layer is thickened, induced electromotive forces are cancelled out between the side wall of the ground conductive layer in the inner layer (or side wall of the power conductive layer in the inner layer) and the power through hole (or ground through hole). Therefore, the loop inductance drops more than a printed wiring board using the same multi-layer core substrate as the sum of the thicknesses of the conductive layers on both sided core substrate or the interlayer insulating layer and the thickness of the respective conductive layers in the multi-layer core substrate. Thus, if a high frequency IC chip, particularly, an IC chip in a high frequency region of 3 GHz or more is mounted, the voltage of the transistor in the IC is always stabilized and as a consequence, no malfunction or error occurs so as to improve the electric characteristics and reliability.

The invention claimed is:

1. A multi-layer printed wiring board comprising:
a core substrate having a plurality of through holes therein, the through holes in the core substrate being disposed so that a ground through hole and a power through hole adjoin each other, wherein a distance between the ground through hole and the power through hole is in a range of 60 to 550 µm;
an interlayer insulating layer formed on the core substrate;
a conductive layer formed on the interlayer insulating layer; and
a plurality of via holes provided in the insulating layer and configured to provide electrical connection between the conductive layer and through holes, wherein:
the core substrate is a multi-layer core substrate composed of three or more layers and including a thick conductive layer as an inner layer, and a conductive layer as a surface layer,
the conductive layer of each inner layer of the core substrate and the conductive layer of each surface layer are a conductive layer for power layer or a conductive layer for grounding, and
the core substrate is so constructed that the thick conductive layer as an inner layer comprises first and second thick conductive layers formed on respective sides of a metallic plate which is electrically insulated by a resin layer, and the conductive layer as a surface layer is formed outside the conductive layer as an inner layer interposed by a resin layer.

2. The multi-layer printed wiring board according to claim 1, wherein the ground through hole in the core substrate including two or more ground through holes and the power through hole including two or more power through holes, such that the ground through holes and the power through holes are disposed in a grid formation or in a staggered formation at adjacent positions.

3. The multi-layer printed wiring board according to claim 1, wherein the diameter of the ground through hole is 50 to 500 µm and the diameter of the power through hole is 50 to 500 µm.

4. The multi-layer printed wiring board according to claim 1, wherein at least one through hole of the ground through holes and the power through holes comprises two or more through holes in a stack structure through all layers of the multi-layer printed wiring board up to an outermost layer.

5. The multi-layer printed wiring board according to any one of claims 1, 2 or 4 wherein the ground through hole and the power through hole are disposed just below an IC chip.

6. The multi-layer printed wiring board according to claim 1 or 2 wherein the thickness of conductive layer on the core substrate is larger than the thickness of the conductive layer on the interlayer insulating layer.

7. The multi-layer printed wiring board according to claim 6, wherein each conductive layer of the core substrate is conductive layer for power layer or conductive layer for grounding.

8. The multi-layer printed wiring board according to claim 1 or 2 wherein assuming that the thickness of the conductive layer on the core substrate is $\alpha 1$
and the thickness of the conductive layer on the interlayer insulating layer is $\alpha 2$, $\alpha 2 < \alpha 1 \leq 40\alpha 2$.

9. The multi-layer printed wiring board according to claim 8 wherein the $\alpha 1$ is in a relation of $1.2\alpha 2 \leq \alpha 1 \leq 40\alpha 2$.

10. The multi-layer printed wiring board according to claim 1, wherein a capacitor is mounted on the surface thereof.

11. The multi-layer printed wiring board according to claim 1 or 2 wherein the core substrate is a multi-layer core substrate composed of three layers.

12. The multi-layer printed wiring board according to claim 11 wherein the conductive layer in the inner layer of the core substrate is composed of two or more layers.

13. The multi-layer printed wiring board according to claim 1, wherein the core substrate is so constructed that the thick conductive layer is disposed as the inner layer and a thin conductive layer is formed as the surface layer disposed on a surface side.

* * * * *